United States Patent
George et al.

(10) Patent No.: US 11,990,516 B1
(45) Date of Patent: May 21, 2024

(54) QUANTUM DOT DEVICES WITH INDEPENDENT GATE CONTROL

(71) Applicant: Intel Corporation, Santa Clara, CA (US)

(72) Inventors: Hubert C. George, Portland, OR (US); Ravi Pillarisetty, Portland, OR (US); Brennen Karl Mueller, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 431 days.

(21) Appl. No.: 17/480,722

(22) Filed: Sep. 21, 2021

(51) Int. Cl.
*H01L 29/12* (2006.01)
*G06N 10/00* (2022.01)
*H01L 27/088* (2006.01)
*H01L 29/66* (2006.01)
*H10N 69/00* (2023.01)

(52) U.S. Cl.
CPC .......... *H01L 29/122* (2013.01); *G06N 10/00* (2019.01); *H01L 27/088* (2013.01); *H01L 29/66977* (2013.01); *H10N 69/00* (2023.02)

(58) Field of Classification Search
CPC ........................... H01L 29/122; H01L 27/088; H01L 29/66977
See application file for complete search history.

(56) References Cited

U.S. PATENT DOCUMENTS

| | | | |
|---|---|---|---|
| 11,038,021 B2 | 6/2021 | Singh et al. | |
| 11,063,040 B2 | 7/2021 | Clarke et al. | |
| 11,063,138 B2 | 7/2021 | Singh et al. | |
| 2019/0043950 A1* | 2/2019 | George | H01L 29/127 |
| 2019/0194016 A1 | 6/2019 | Roberts et al. | |
| 2020/0135864 A1 | 4/2020 | Singh et al. | |
| 2020/0350423 A1 | 11/2020 | Pillarisetty et al. | |

* cited by examiner

*Primary Examiner* — Wasiul Haider
(74) *Attorney, Agent, or Firm* — Akona IP PC

(57) ABSTRACT

Quantum dot devices with independent gate control are disclosed. An example quantum dot device includes N parallel rows of gate lines provided over a quantum well stack. Each of the N parallel rows of gate lines defines a respective row of a quantum dot formation region in the quantum well stack and includes M parallel gate lines stacked above one another. The quantum dot device may further include, for each of the N×M gate lines, a gate that extends toward the quantum well stack, where, for an individual row of the N parallel rows, gates that extend toward the quantum well stack from the M parallel stacked gate lines are arranged above a respective row of a quantum dot formation region in the quantum well stack. In this manner, each of the N×M gates responsible for formation of different quantum dots may be controlled independently.

20 Claims, 38 Drawing Sheets

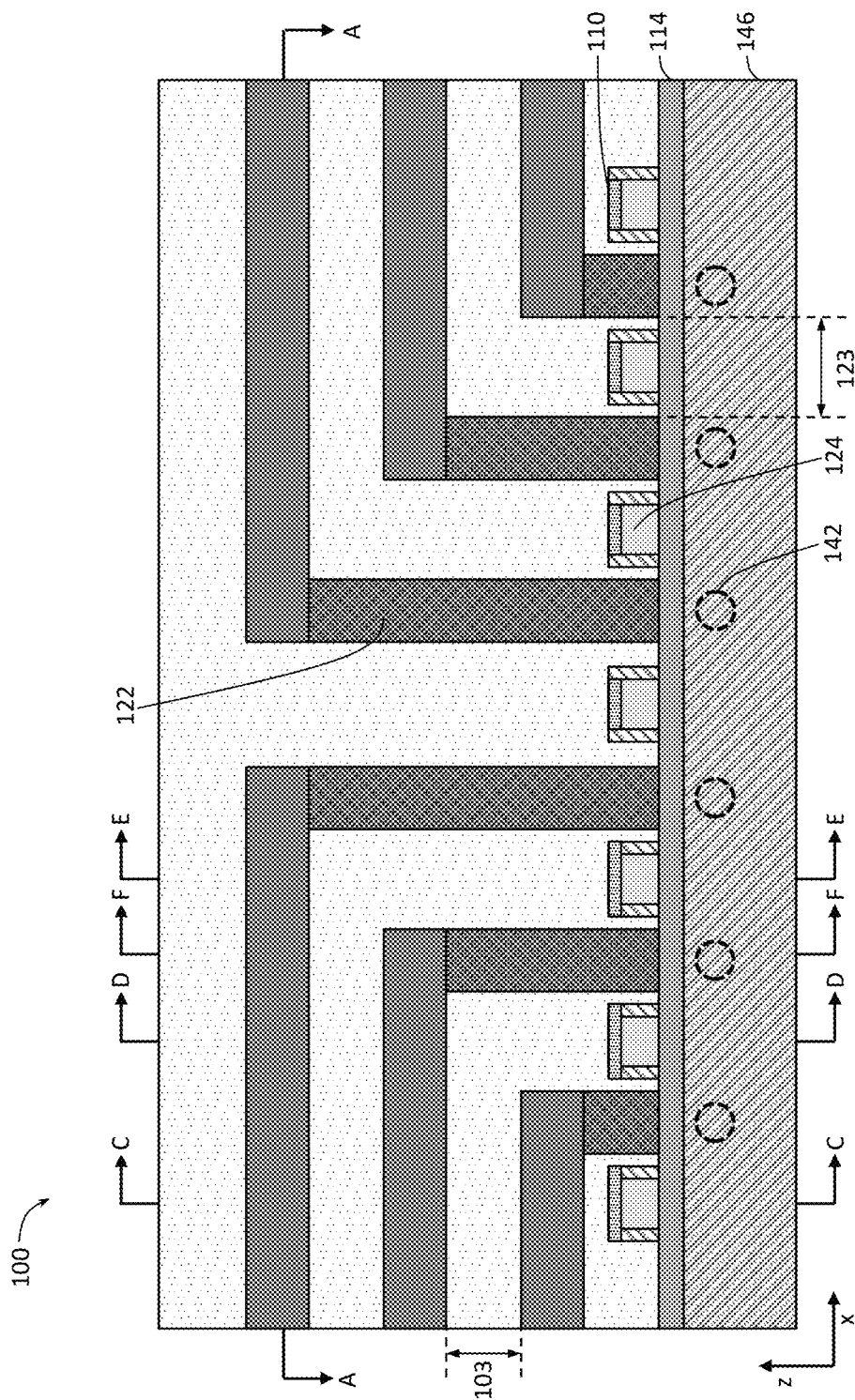

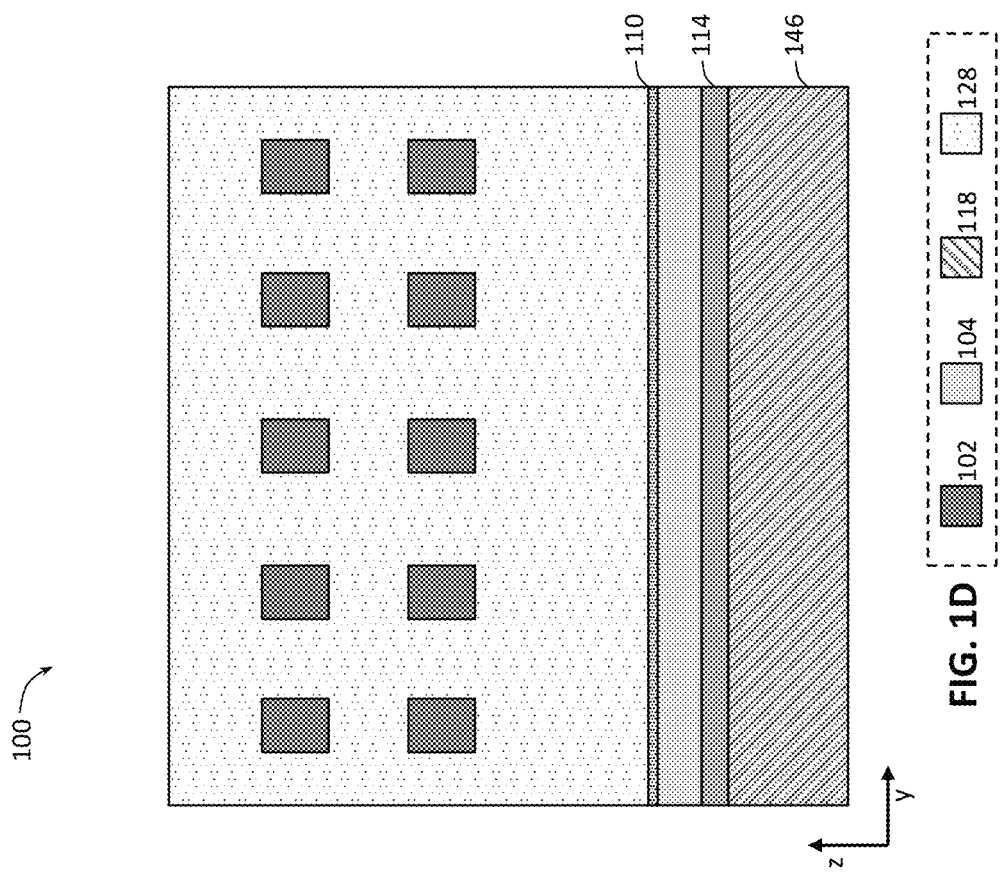

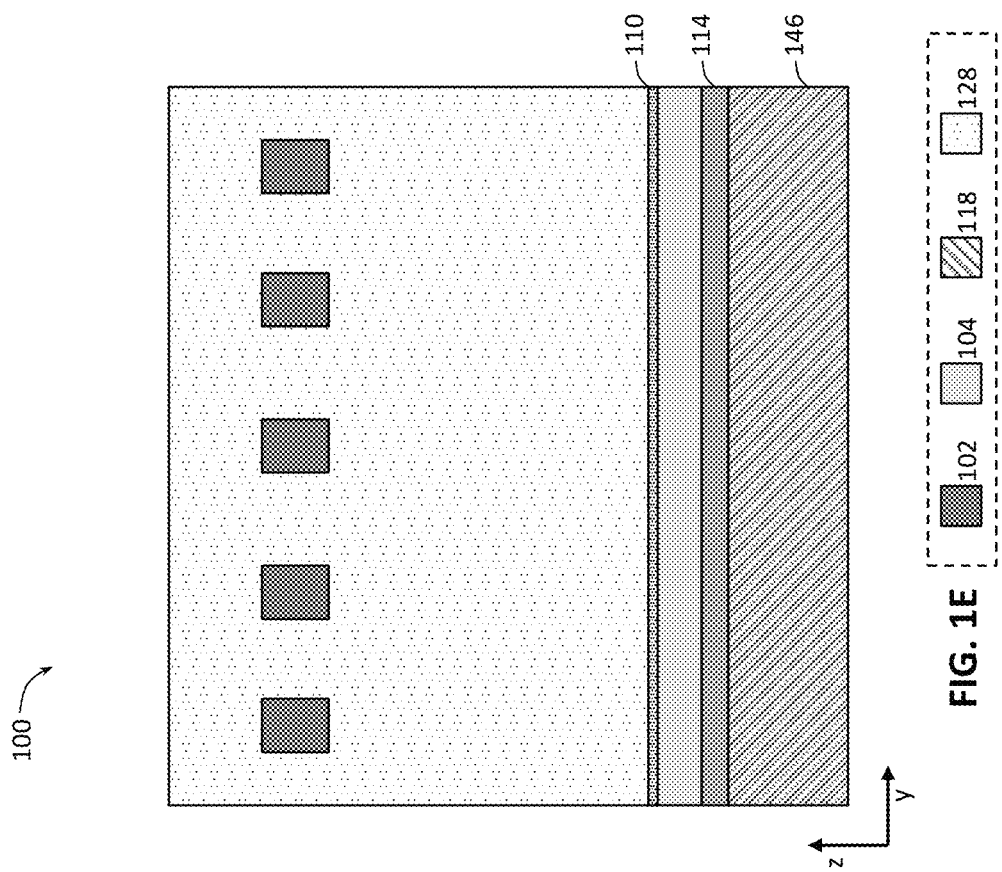

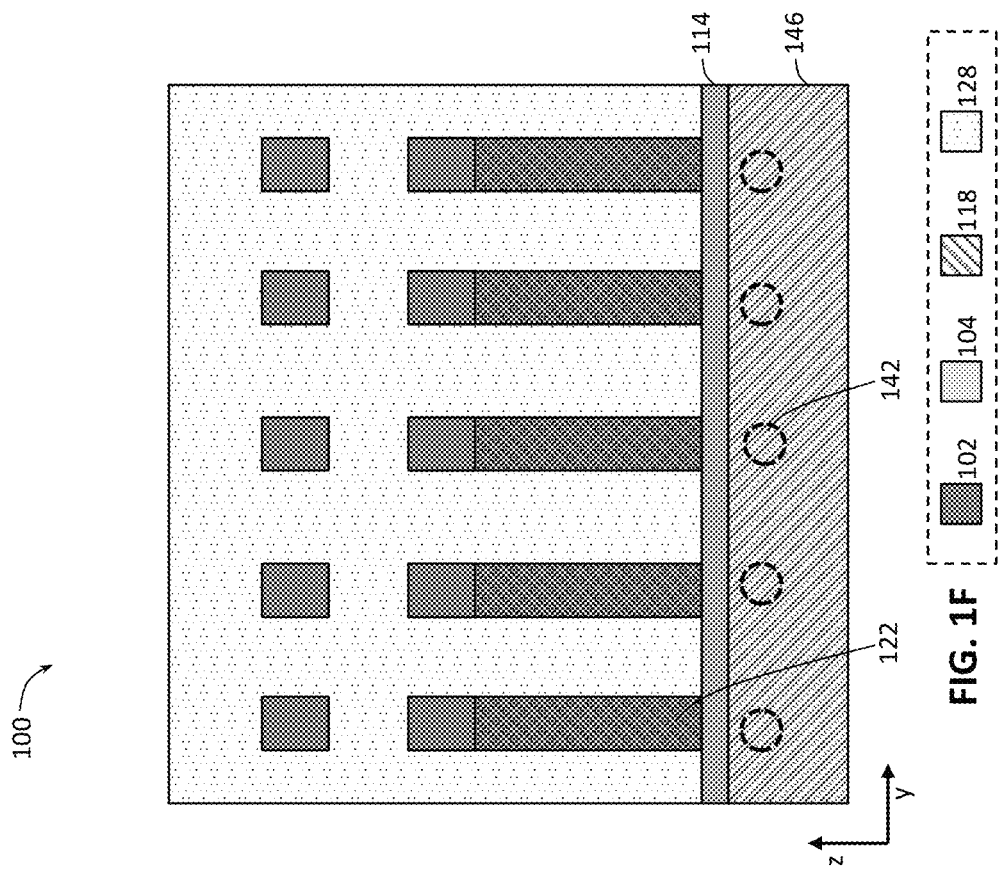

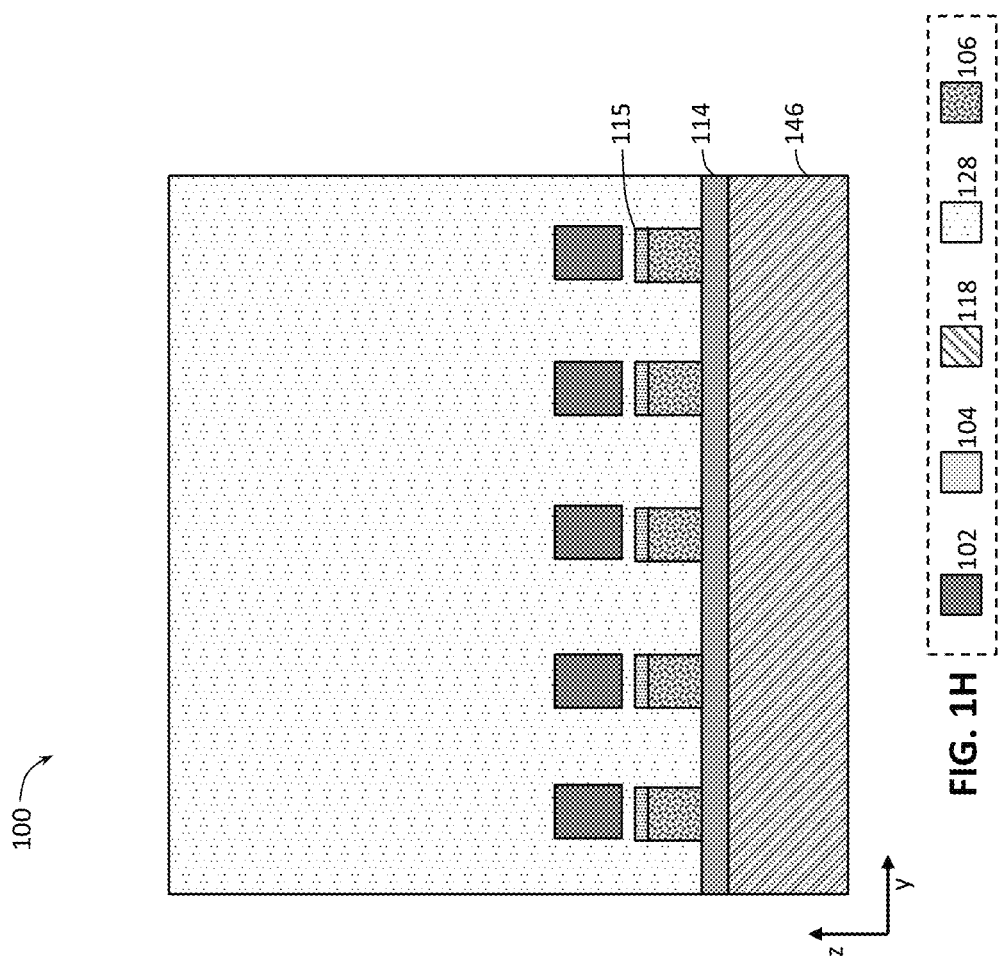

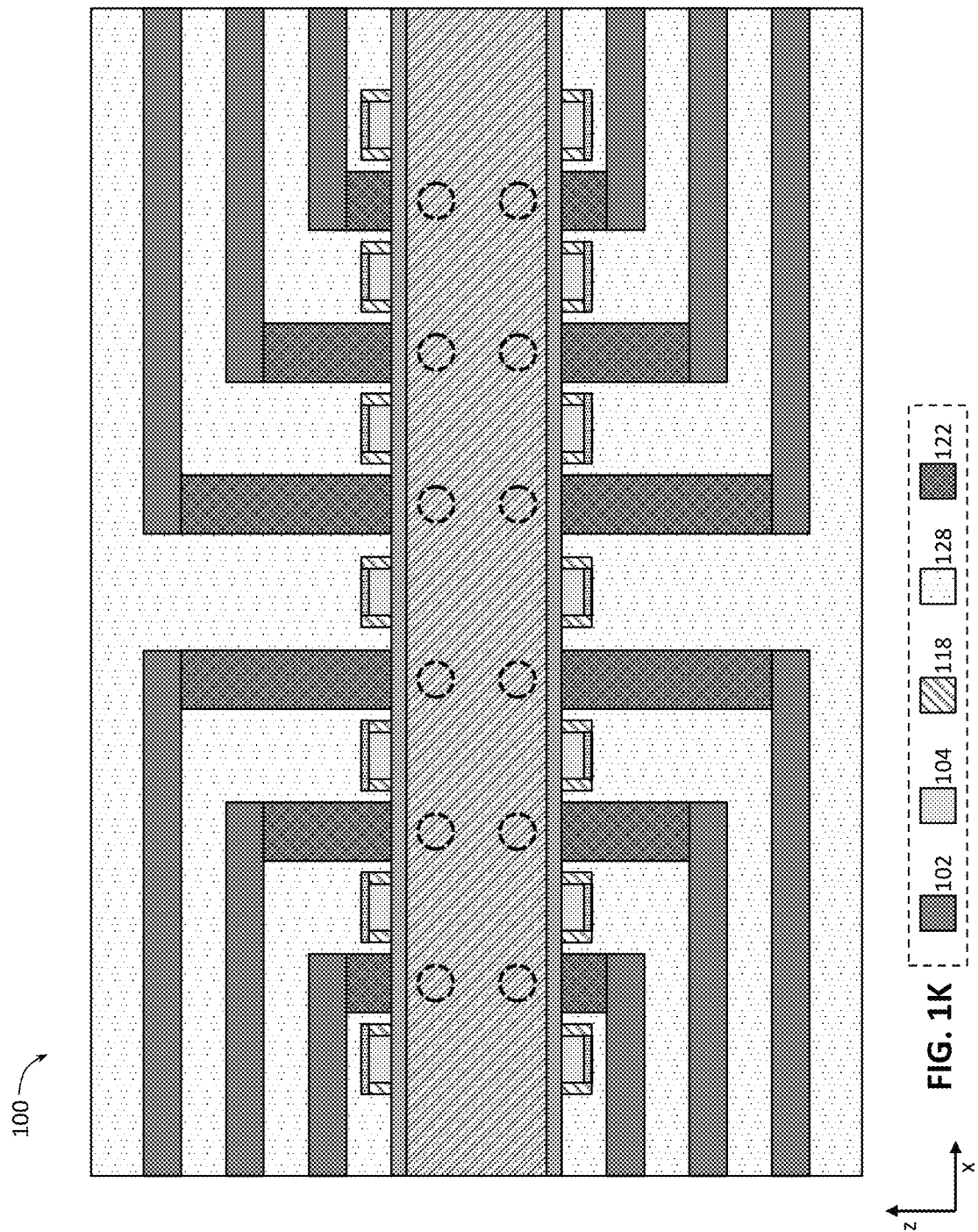

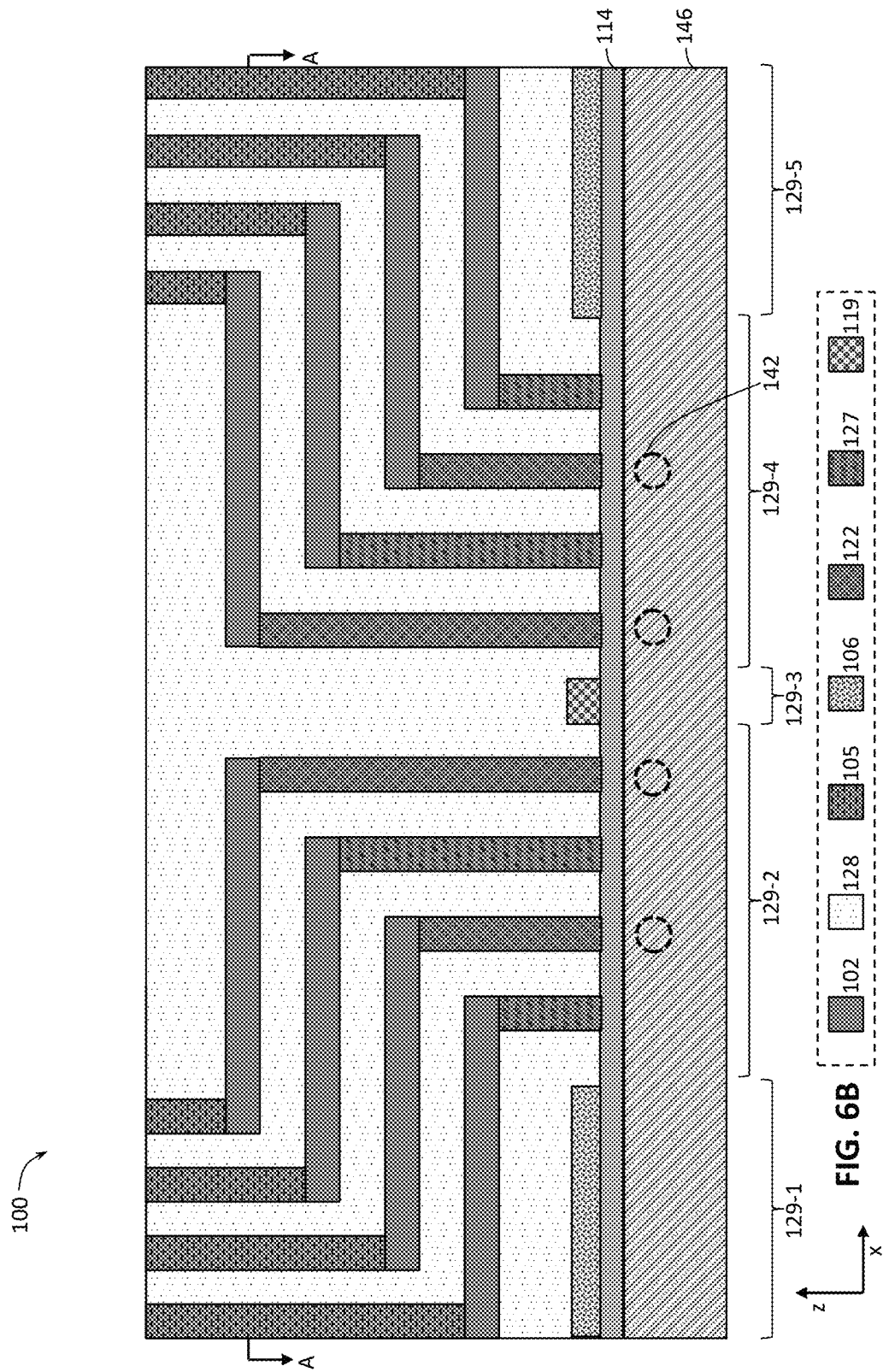

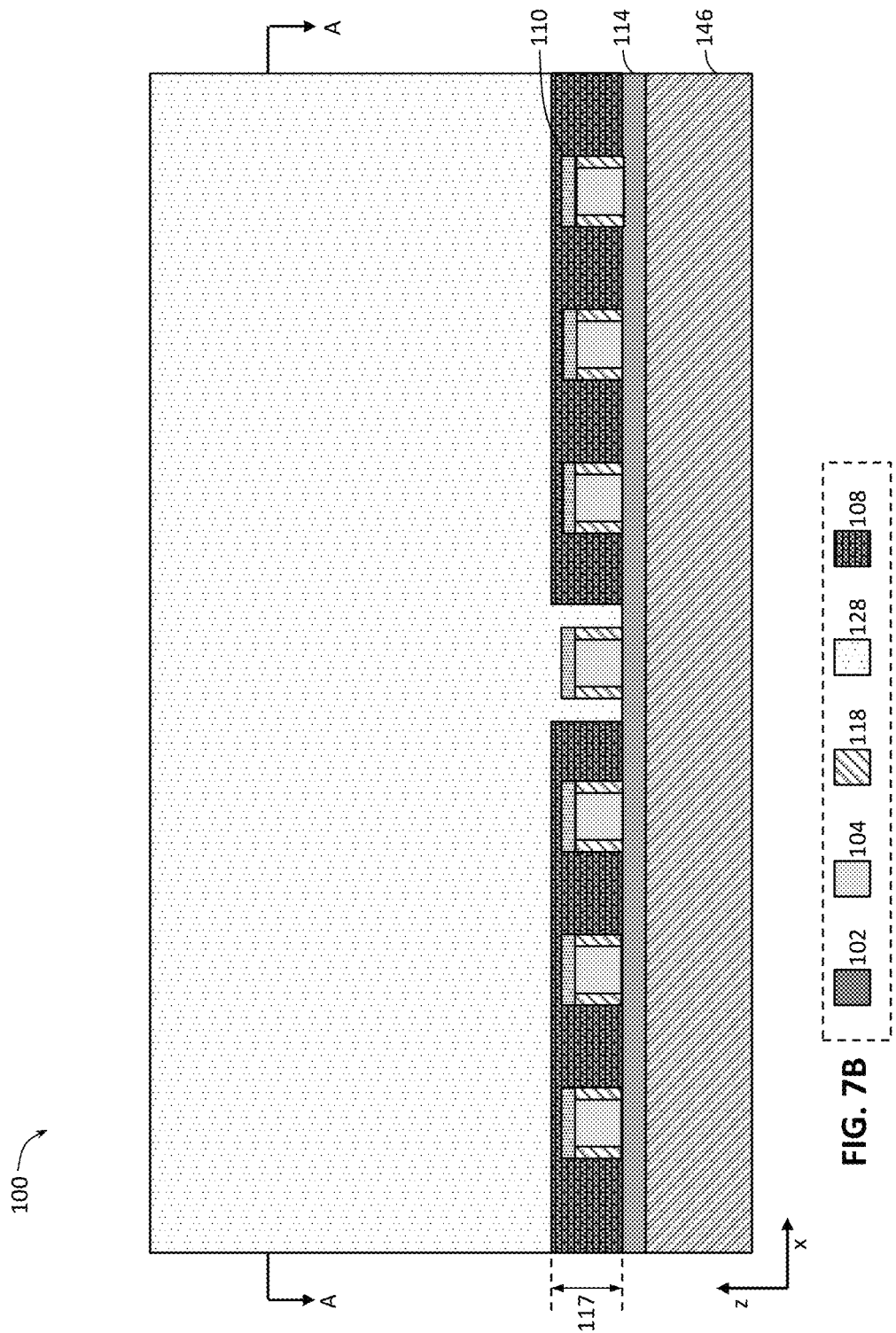

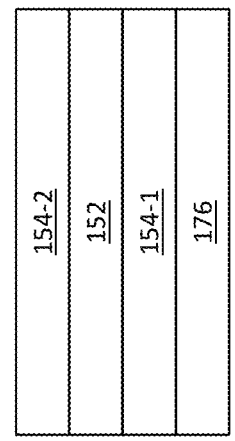
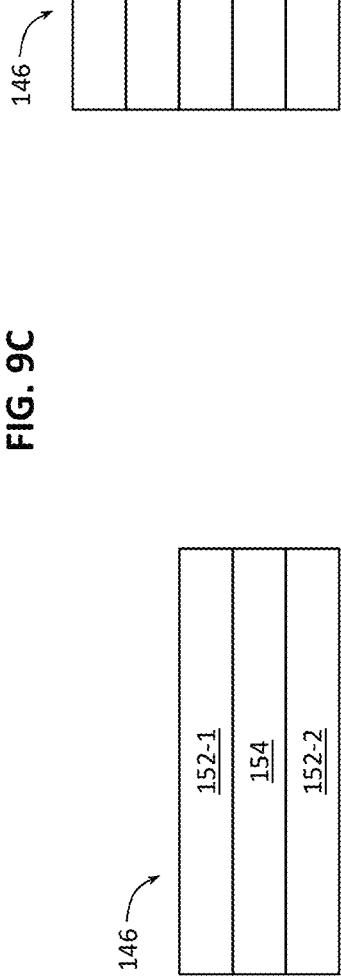
FIG. 9A
FIG. 9B
FIG. 9C
FIG. 9D
FIG. 9E

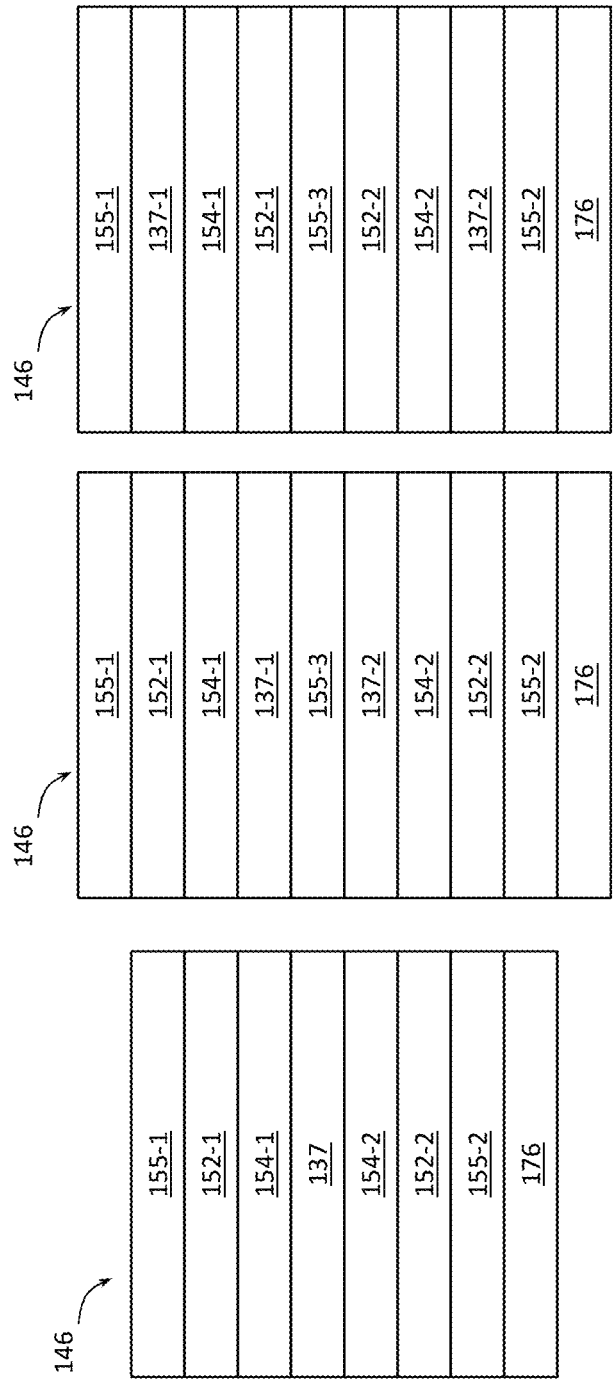

QUANTUM DOT DEVICES WITH INDEPENDENT GATE CONTROL

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1K are various views of a quantum dot device with independent gate control, according to a first set of embodiments of the present disclosure.

FIGS. 6A-6C are various views of a quantum dot device with independent gate control, according to a sixth set of embodiments of the present disclosure.

FIGS. 7A-7B are various views of a quantum dot device with independent gate control, according to a seventh set of embodiments of the present disclosure.

FIGS. 9A-9H illustrate various examples of quantum well stacks that may be included in any of the quantum dot devices with independent gate control, in accordance with various embodiments.

DETAILED DESCRIPTION

Figure 1A:
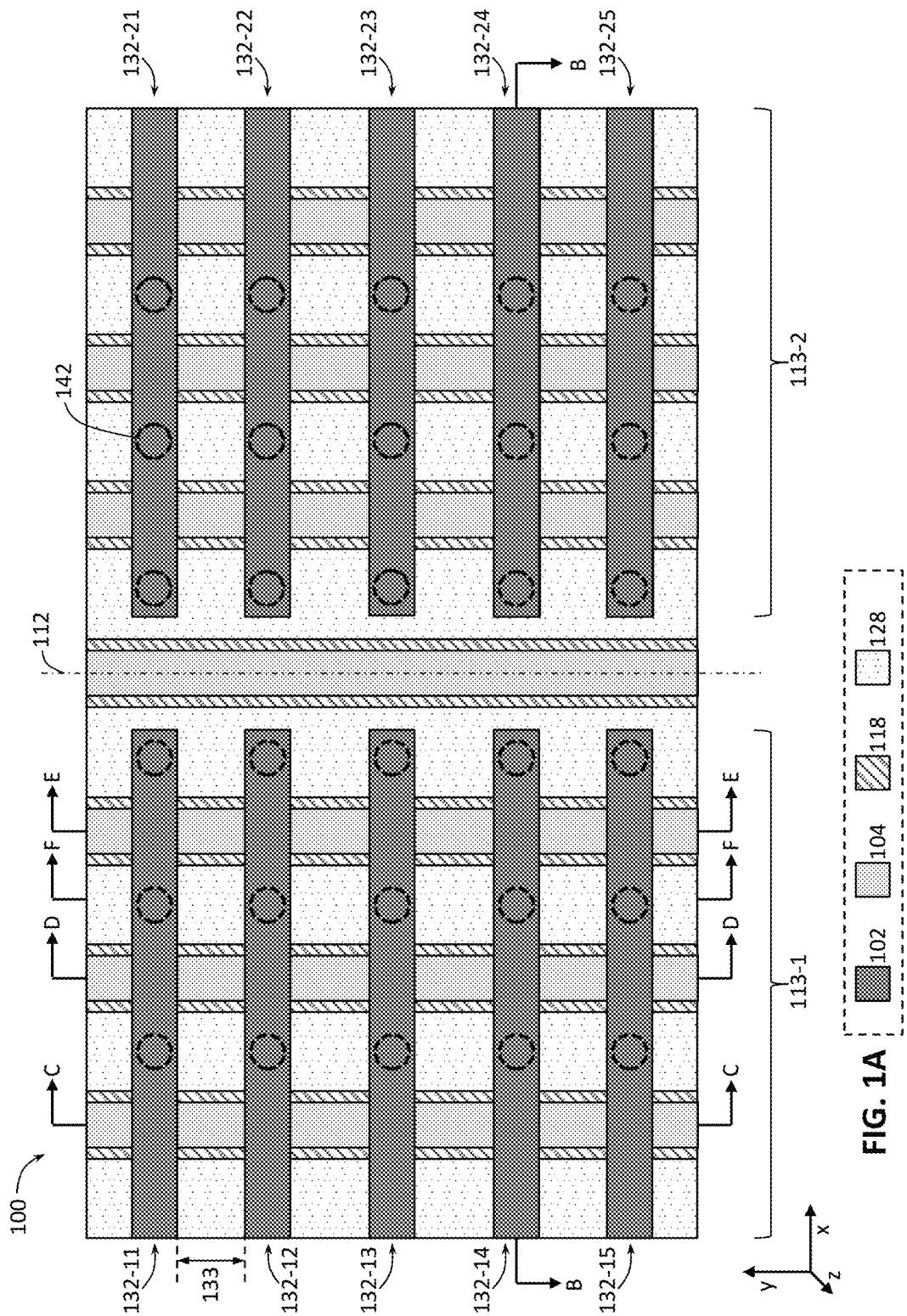

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating quantum dot devices with independent gate control, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Devices implementing quantum dot qubits (referred to herein as "quantum dot devices") are particularly promising for large-scale qubit implementation.

In general, quantum dot devices enable formation of quantum dots to serve as quantum bits (i.e., as qubits) in a quantum computing device, as well as the control of these quantum dots to perform quantum logic operations. To that end, quantum dot devices implement multiple terminals, such as gate terminals of various types of gates (e.g., barrier gates, plunger gates, and accumulation gates) as well as terminals for making electrical contact with doped regions of a semiconductor material (which may be referred to as "source terminals" and "drain terminals"). DC bias control signals and alternating current (AC) pulses applied to various terminals may be used to control formation of quantum dots in such devices. Single electron transistor (SET) detectors, provided proximate to quantum dot qubits, may then be used to detect states of various qubits.

As an example, a qubit array of a quantum dot device may include N parallel rows of quantum dot formation regions (i.e., rows in which quantum dots may be formed) for forming quantum dots of various qubits, where M quantum dots may be formed in each of the N rows (hence, such a qubit array may be referred to as an "N×M qubit array"). In conventional implementations, a single gate line is typically used to apply signals to multiple gates (e.g., to M gates under each of which a single quantum dot may be formed) along a given row of a quantum dot formation region. This means that a single voltage is typically used to form quantum dot qubits (e.g., M quantum dot qubits) along a given row. While such an approach may be acceptable because of its relative simplicity in terms of fabrication and operation of quantum dot devices, it does not allow to tune individual qubits formed along a given row to, e.g., compensate for potential landscape nonuniformities. It may also be limited in the amount of control over qubit-to-qubit interactions.

Quantum dot devices with independent gate control, and related systems and methods, are disclosed herein. An example quantum dot device may include a quantum well stack and N parallel rows of gate lines provided over the quantum well stack, the individual ones of the N parallel rows being at a distance from one another. Each of the N parallel rows of gate lines defines a respective (i.e., different) corresponding row of a quantum dot formation region in the quantum well stack (i.e., each of the N parallel rows of gate lines defines a different row in the quantum well stack along which quantum dots may be formed). Each of the N parallel rows of gate lines includes M parallel gate lines stacked above one another, at a distance from one another, where each of N and M is an integer greater than 1. The quantum dot device further may include, for each of the gate lines, a gate that extends toward the quantum well stack, where, for an individual row of the N parallel rows of the gate lines, the gates that extend toward the quantum well stack from the M parallel gate lines (e.g., M such gates) are electrically isolated from one another and are arranged above a respective row of a quantum dot formation region in the quantum well stack. In this manner, each of the N×M gates responsible for formation of different quantum dots may be controlled independently because each of the gate lines may be coupled to respective signal sources (e.g., voltage sources). Quantum dot devices with independent gate control as described herein may be used to apply microwave pulses for qubit control and/or to control electrostatics so that different quantum dots may be sufficiently isolated from one another or may interact with one another, as needed to perform various quantum logic operations using quantum dot qubits. In various embodiments, quantum dot devices with independent gate control as described herein may be implemented as single-sided devices or as double-sided devices. In single-sided devices, various gate lines and gates are provided on one side of a quantum well stack, while, in double-sided devices, various gate lines and gates are provided on both sides of the quantum well stack. Some examples of double-sided implementations are shown in the present drawings (e.g., FIG. 1K illustrates one double-sided embodiment corresponding to a single-sided embodiment shown in FIG. 1B). However, in general gate lines and gates implemented on different sides of a quantum well stack of any of the quantum dot devices described herein do not have to be identical as shown the examples of the present drawings. In fact, in some embodiments, one side of a quantum well stack of a quantum dot device may include gate lines and gates according to any one of the embodiments of the quantum dot devices with independent gate control as described herein, while the other side may include gate lines and gates according to a different one of the embodiments.

Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. In particular, by providing M parallel gate lines stacked above one another to define a given row of a quantum dot formation region, and by implementing gates that extend from different ones of the M parallel stacked gate lines towards a quantum well stack, independent control of the gates may be realized, thus enabling great flexibility over qubit control and readout. Such an arrangement is drastically different from the conventional implementations described above, where a single gate line is provided along a given row of a quantum dot formation region, with multiple gates extending towards the quantum well stack from such a single line.

In various embodiments, quantum dot devices with independent gate control as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular various gates and conductive vias described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures).

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For ease of discussion, all the lettered sub-figures associated with a particular numbered figure may be referred to by the number of that figure; for example, FIGS. 1A-1K may be referred to as "FIG. 1," FIGS. 2A-2D may be referred to as "FIG. 2," etc.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area. The disclosure may use a singular term "layer" or "material" but such terms should be understood to refer to assemblies that may include multiple different layers or multiple different materials.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B), while the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% of a target value, e.g., +/−10% of a target value or +/−5% of a target value, based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Figure 1C:
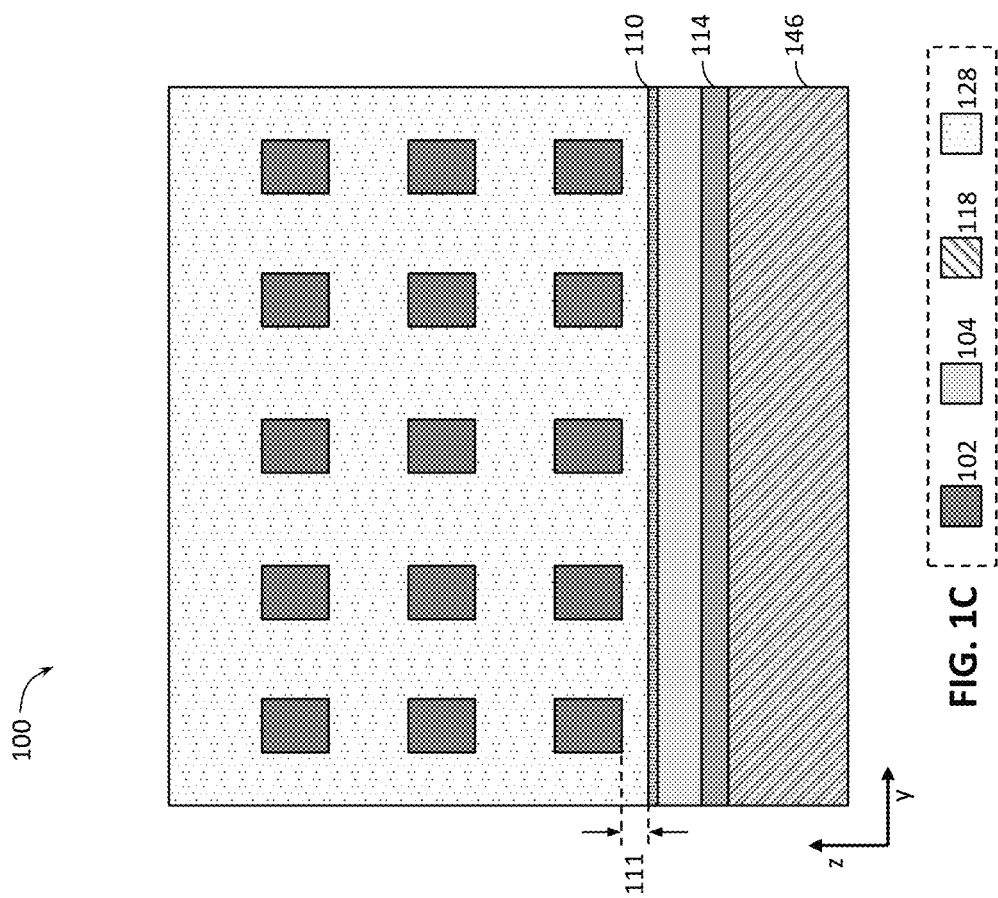
Figure 1G:
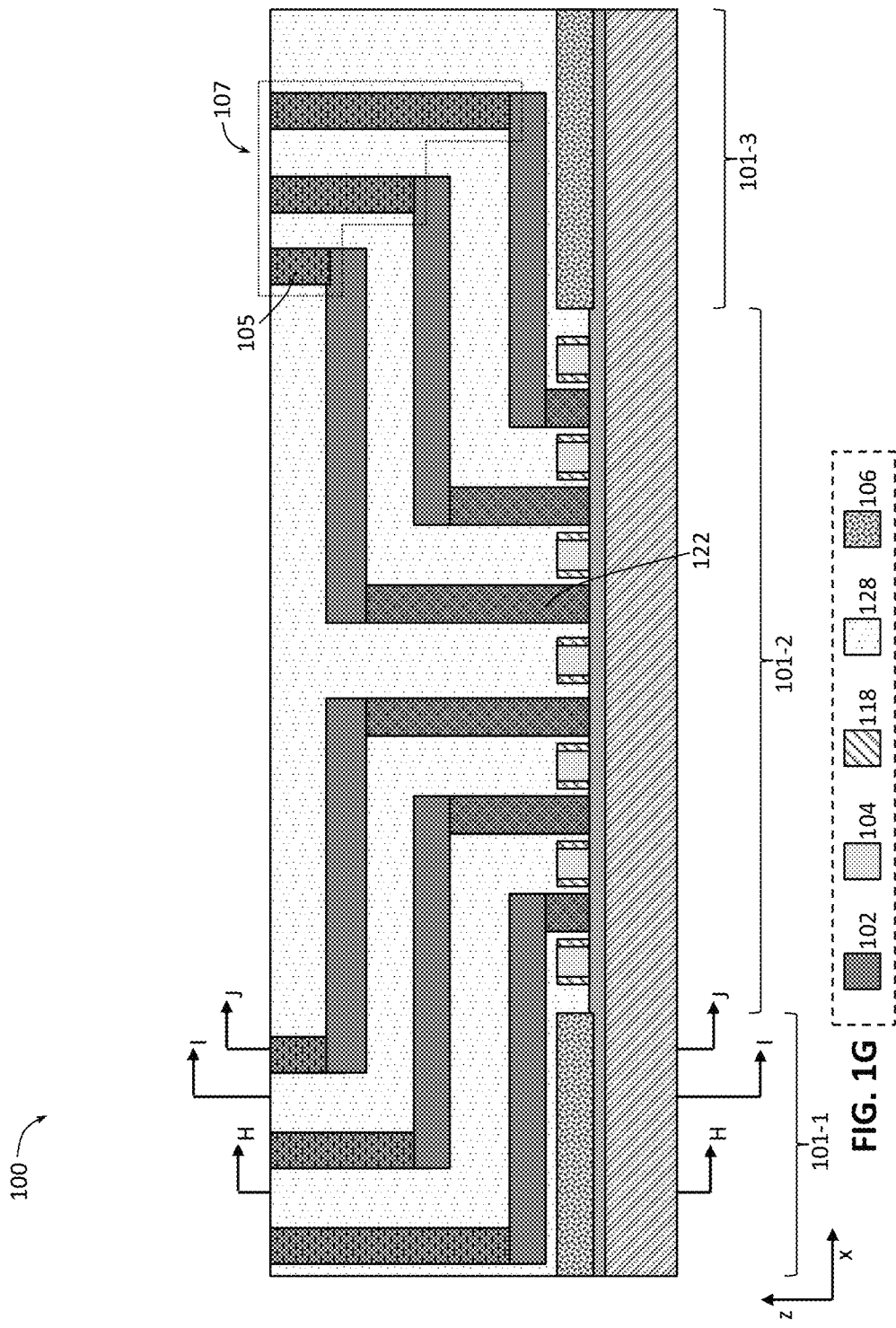
Figure 1I:
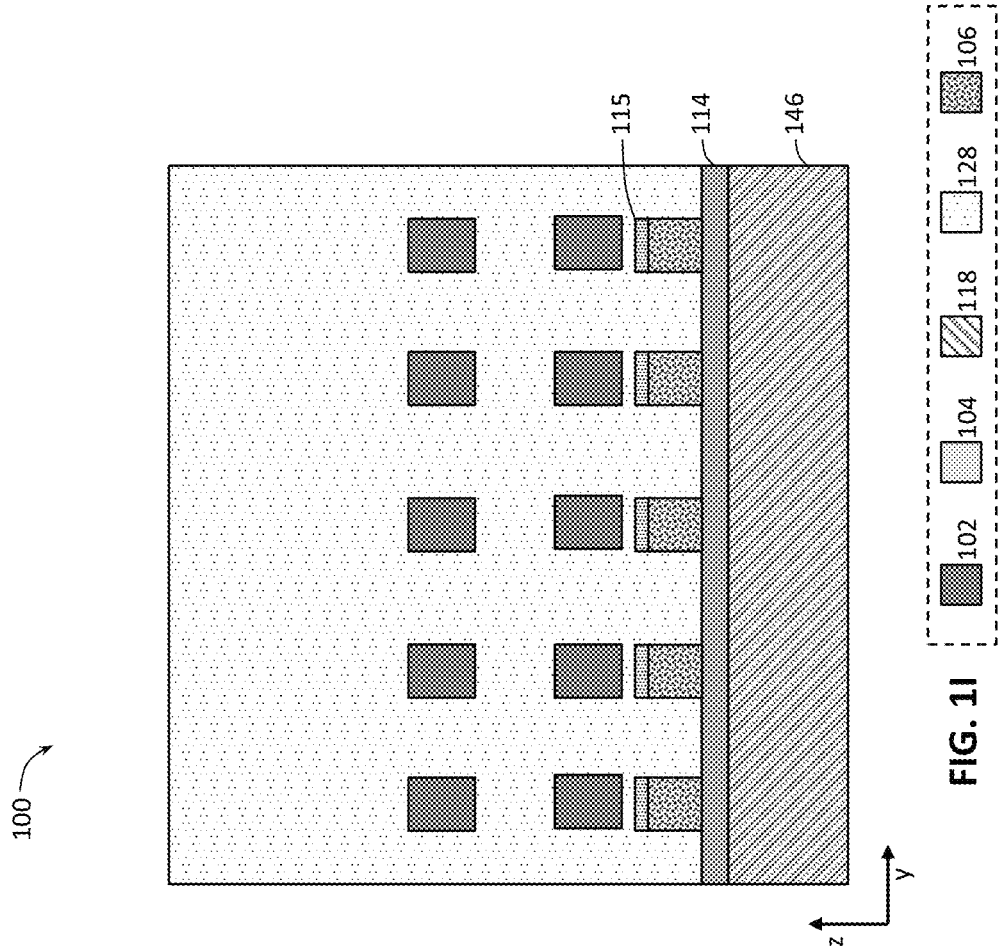
Figure 1J:
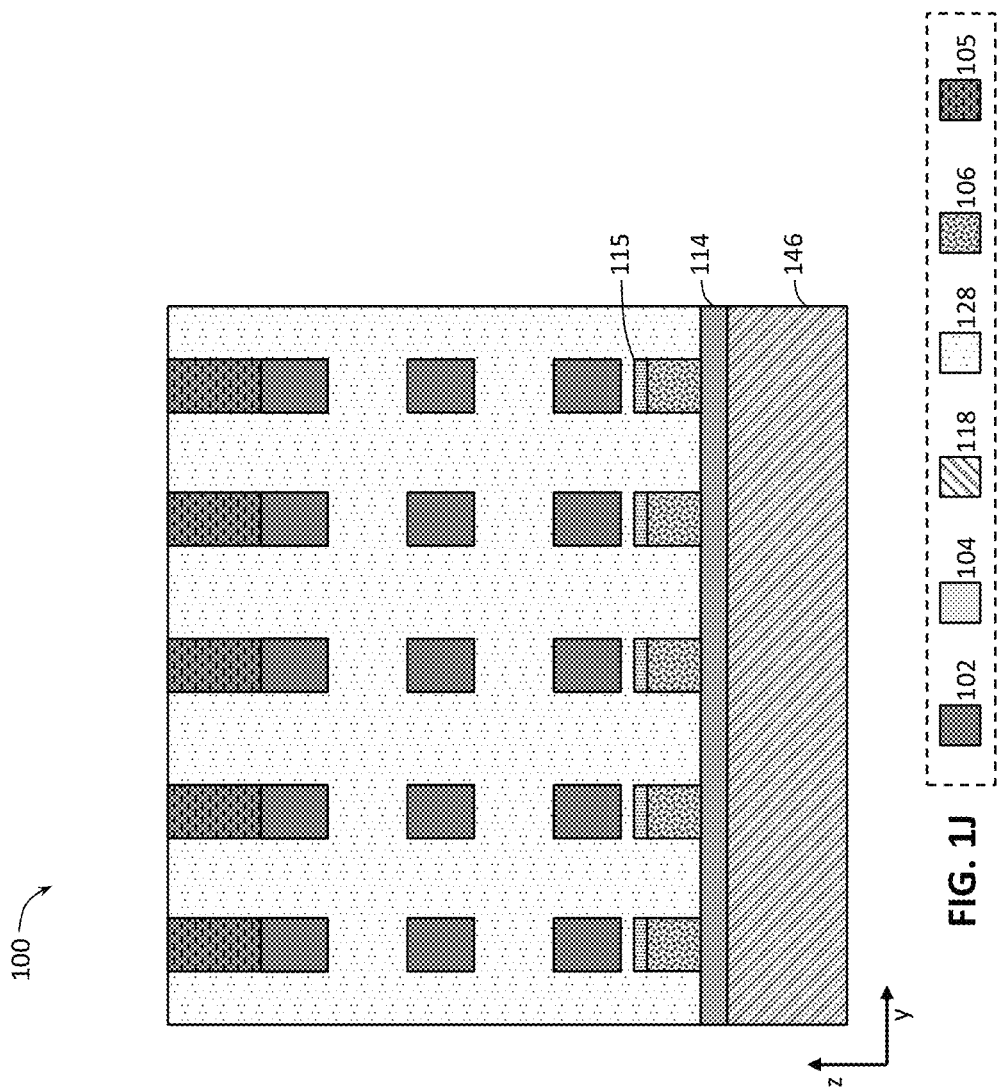

FIGS. 1A-1K are various views of a quantum dot device 100 with independent gate control, according to a first set of embodiments of the present disclosure. FIG. 1A is a top view of a portion of the quantum dot device 100 with some of the materials removed so that first gate lines 102 and second gate lines 104 are visible. Although many of the drawings and description herein may refer to a particular set of lines or gates as "barrier" or "plunger" lines or gates, respectively, this is simply for ease of discussion, and in other embodiments, the role of "barrier" and "plunger" lines and gates may be switched (e.g., barrier gates may instead act as plunger gates, and vice versa). FIGS. 1B-1J are cross-sectional side views of the quantum dot device 100 of FIG. 1A. In particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A; FIG. 1G is a zoomed-out version of FIG. 1B so that third gate lines 106 of the quantum dot device 100 fit on the page of the drawing; FIG. 1H is a view through the section H-H of FIG. 1G, FIG. 1I is a view through the section I-I of FIG. 1G, and FIG. 1J is a view through the section J-J of FIG. 1G. FIG. 1K is a cross-sectional side view similar to that of FIG. 1B, but illustrating a double-sided embodiment of the quantum dot device 100.

The quantum dot device 100 of FIG. 1 may be operated in any of a number of ways. For example, in some embodiments, electrical signals (e.g., voltages, currents, radio frequency (RF), and/or microwave signals) may be provided to one or more first gate line 102, second gate line 104, and/or third gate line 106 to cause a quantum dot 142 (e.g., an electron spin-based quantum dot or a hole spin-based quantum dot) to form in a quantum well stack 146 under one or more of gates 122 extending from different ones of the first gate lines 102. Electrical signals provided to a first gate line 102 may control the electrical potential of a quantum well under the gate 122 of that first gate line 102, while electrical signals provided to one or more of the second gate lines 104 may control the potential energy barrier under gates 124 formed by the second gate lines 104, thereby controlling the electrical potential between adjacent quantum wells. Thus, the gates 122, extending from the first gate lines 102, may be used as plunger gates to enable the formation of quantum dots 142 under the gates 122, while the gates 124 formed by portions of the second lines 104 in between adjacent ones of the gates 122 may be used as barrier gates to adjust the potential barrier between quantum dots 142 formed under adjacent gates 122. Quantum interactions between quantum dots in different quantum wells in the quantum well stack 146 (e.g., under different plunger gates) may be controlled in part by the potential energy barrier provided by the barrier potentials imposed between them (e.g., by intervening barrier gates).

One gate 122 and a corresponding one quantum dot 142 are labeled in FIG. 1B, however multiple such gates 122 and multiple quantum dots 142 are shown in each of the present drawings, where the gates 122 are illustrated as conductive vias (i.e., interconnects shown as vertical rectangles with the same pattern in the cross-sectional side views of the IC devices 100 of various drawings) extending from respective first gate lines 102 towards the quantum well stack 146, and where the quantum dots 142 are schematically represented by dashed circles within the quantum well stack 146 under some of the gates 122. Similarly, one gate 124 is labeled in FIG. 1B, however, multiple such gates 124 are formed by portions of the second gate lines 104 in between adjacent ones, or in proximity to different ones, of the gates 122.

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of the quantum dots 142 in the quantum well stack 146.

In the quantum dot device 100 of FIG. 1, a gate dielectric 114 may be disposed on or over a quantum well stack 146. A quantum well stack 146 may include at least one quantum well layer 152 (not shown in FIG. 1) in which quantum dots may be localized during operation of the quantum dot device 100. Examples of quantum well stacks 146 are discussed below with reference to FIG. 7. The gate dielectric 114 may be any suitable material, such as a high-k material.

Multiple parallel second gate lines 104 may be disposed on or over the gate dielectric 114, and spacer material 118 may be disposed on or over side faces of the second gate lines 104. In some embodiments, a patterned hardmask 110 may be disposed on or over the second gate lines 104 (with the pattern corresponding to the pattern of the second gate lines 104), and the spacer material 118 may extend up the sides of the hardmask 110, as shown. The second gate lines 104 may each form a gate 124. In some embodiments, the gates 124 may be used as barrier gates. Different ones of the second gate lines 104 may be electrically controlled in any desired combination (e.g., each second gate line 104 may be separately electrically controlled, or some or all the second gate lines 104 may be shorted together in one or more groups, as desired).

Multiple parallel first gate lines 102 may be disposed over and between the second gate lines 104. As illustrated in FIG. 1, in some embodiments, the first gate lines 102 may be arranged substantially perpendicular (in the x-y plane of the example coordinate system shown in the present drawings) to the second gate lines 104. In particular, the first gate lines 102 may be arranged in N parallel rows 132, where N is an integer greater than 1, e.g., as is illustrated in FIG. 1A with five rows 132 of the first gate lines 102 shown on the left side of FIG. 1A (i.e., to the left of a dash-dotted line 112 shown in FIG. 1A, in what may be considered as a first qubit array 113-1, where the individual instances of rows 132 are labeled as rows 132-11, 132-12, and so on) and another five rows 132 shown on the right side of FIG. 1A (i.e., to the right of a dash-dotted line 112 shown in FIG. 1A, in what may be considered as a second qubit array 113-2, where the individual instances of rows 132 are labeled as rows 132-21, 132-22, and so on). In some embodiments, a distance 133 (e.g., labeled in FIG. 1A) between adjacent rows 132 may be between about 10 and 500 nanometers, including all values and ranges therein, e.g., between about 20 and 250 nanometers, or between about 25 and 100 nanometers. In some embodiments, distances between at least some pairs of adjacent rows 132 of the first gate lines 102 may be different. In other embodiments, the adjacent rows 132 of the first gate lines 102 may be arranged equidistant from one another, i.e., the distance between all pairs of adjacent rows 132 of the first gate lines 102 may be substantially the same.

Within each one of the rows 132, M of the first gate lines 102 may be stacked above one another, where M is an integer greater than 1, e.g., as is illustrated in FIG. 1B with three parallel first gate lines 102 being stacked above one another in a given row 132. Various parallel stacked first gate lines 102 within a given row 132 are provided at a distance from one another, e.g., arranged in a regular pattern with equal spacing between adjacent first gate lines 102 stacked above one another, with an insulator material 128 electrically isolating different first gate lines 102 within a given row 132 from one another. Furthermore, the insulator material 128 may further electrically isolate different first gate lines 102 of different rows 132 from one another. In some embodiments, different parallel stacked first gate lines 102 within one of the rows 132 may be provided in substantially the same planes with respect to the quantum well stack 146 as corresponding parallel stacked first gate lines 102 within other rows 132. Therefore, while FIG. 1B represents a cross-section along a plane B-B that extends along one of the rows 132 on the left side of FIG. 1A and one of the rows 132 on the right side of FIG. 1A, cross-sections along analogous planes extending along other rows 132 shown in FIG. 1A may be substantially identical with that shown in FIG. 1B. In some embodiments, a distance 103 (e.g., labeled in FIG. 1B) between adjacent parallel stacked first gate lines 102 within a given row 132 may be between about 10 and 500 nanometers, including all values and ranges therein, e.g., between about 20 and 300 nanometers, or between about 25 and 200 nanometers. In some embodiments, distances between at least some pairs of adjacent parallel stacked first gate lines 102 may be different. In other embodiments, the parallel stacked first gate lines 102 may be stacked equidistant from one another, i.e., the distance between all pairs of adjacent parallel stacked first gate lines 102 may be substantially the same.

The first gate lines 102 may extend above the hardmask 110 (and at a distance from the hardmask 110, as, e.g., can be seen in FIG. 1C). For example, the one of the parallel stacked first gate lines 102 that is closest to the hardmask 110 may be at a distance 111 (e.g., labeled in FIG. 1C) that is between about 5 and 200 nanometers, including all values and ranges therein, e.g., between about 10 and 100 nanometers, or between about 20 and 50 nanometers. Gates 122 may extend from the first gate lines 102 (e.g., one gate 122 per gate line 102) down toward the quantum well stack 146 and contact the gate dielectric 114 between adjacent ones of the second gate lines 104, e.g., as illustrated in FIG. 1B. In some embodiments, the gates 122 may be used as plunger gates. In some embodiments, the gates 122 may fill the area between adjacent ones of the second gate lines 104/spacer material 118 structures; in other embodiments, an insulator material 128 may be present between the second gate lines 104/spacer material 118 structures and the proximate the gates 122, e.g., as illustrated in FIG. 1B. In some embodiments, a distance 123 (e.g., labeled in FIG. 1B) between gates 122 within a given row 132 may be between about 10 and 400 nanometers, including all values and ranges therein, e.g., between about 20 and 200 nanometers, or between about 25 and 100 nanometers. In some embodiments, distances between at least some pairs of adjacent gates 122 may be different. In other embodiments, the adjacent gates 122 may be arranged equidistant from one another, i.e., the distance between all pairs of adjacent gates 122 may be substantially the same.

In some embodiments, spacer material 118 may be disposed on side faces of the first gate lines 102 (not shown); in other embodiments, no spacer material 118 may be disposed on side faces of the first gate lines 102. In some embodiments, a hardmask (not shown) may be disposed above the first gate lines 102, e.g., similar to how the hardmask 110 may be disposed above the second gate lines 104. Different ones of the gates 122 of the first gate lines 102 in a given row 132 may be electrically discontinuous from one another because they extend from different ones of the M parallel stacked first gate lines 102 of the row 132, because different ones of the M parallel stacked first gate lines 132 are electrically isolated from one another by the insulator material 128, and because different ones of the gates 122 are electrically isolated from one another by the insulator material 128. Different ones of the first gate lines 102 may be electrically controlled in any desired combination. In particular, in the most general case, each first gate line 102 may be separately electrically controlled, thus providing independent gate control of the gates 122, although, in some embodiments, subsets of the first gate lines 102 may be shorted together (or coupled to the same signal source) in one or more groups, as desired. Together, the first gate lines 102 and the second gate lines 104 may form a grid, as depicted in FIG. 1.

Not illustrated in FIGS. 1A-1F (or FIGS. 2-4, discussed below), are accumulation regions that may be electrically coupled to the quantum well layer of the quantum well stack 146 (e.g., laterally proximate to the quantum well layer). The accumulation regions may be spaced apart from the gate lines (e.g., both from the first gate lines 102 and from the second gate lines 104) by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the gates 122 (e.g., by controlling the voltages on the gates 122 and the gates 124) to form carrier-based quantum dots (e.g., electron or hole quantum dots, including a single charge carrier, multiple charge carriers, or no charge carriers). In other embodiments (e.g., as discussed below with reference to FIG. 7), a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein (e.g., the quantum dot devices 100 discussed herein with reference to FIGS. 1-4).

In some embodiments, third gate lines 106 may be disposed on or over the gate dielectric 114. One example is shown in FIGS. 1G-1J. In some embodiments, multiple parallel third gate lines 106 may be disposed on or over the gate dielectric 114, and spacer material (not shown) may be disposed on or over side faces of the third gate lines 106. In some embodiments, multiple parallel third gate lines 106 may be provided as parallel rows substantially perpendicular to the parallel second gate lines 104. In some embodiments, multiple parallel third gate lines 106 may be substantially aligned with the rows 132 of the first gate lines 102, e.g., each of the third gate lines 106 may be between the quantum well stack 146 and a different one of the N parallel rows 136 of the first gate lines 102. In such embodiments, for the each of the third gate lines 106, the M parallel stacked first gate lines 102 of the different one of the N parallel rows 132 may be stacked above the respective third gate line 106. In some embodiments, a patterned hardmask 115 may be disposed on or over the third gate lines 106 (with the pattern corresponding to the pattern of the third gate lines 106), e.g., as shown in FIGS. 1H-1J. The third gate lines 106 may each form a gate of the quantum dot device 100. In some embodiments, the gates formed by the third gate lines 106 may be used as accumulation gates. To that end, portions of the third gate lines 106 may overlap with portions of the respective accumulation regions described above. In some such embodiments, portions of the quantum well stack 146 directly under some portions of the third gate lines 106 (e.g., some parts of portions 101-1 and 101-3, labeled in FIG. 1G) may include doped regions, e.g., regions with dopant concentration of at least about $10^{18}$ dopants per cubic centimeter ($cm^{-3}$), including all values and ranges therein, e.g., at least about $10^{20}$ $cm^{-3}$, or at least about $10^{21}$ $cm^{-3}$. On the other hand, the portions of the quantum well stack 146 where the quantum dots are to be formed during operation of the quantum dot device 100 (i.e., in quantum dot formation regions, e.g., in a portion 101-2, labeled in FIG. 1G) may have lower dopant concentrations, and may include intrinsic semiconductor materials. For example, the portions of the quantum well stack 146 where the quantum dots are to be formed (e.g., in a portion 101-2) may have dopant concentrations below about $10^{18}$ $cm^{-3}$, including all values and ranges therein, e.g., below about 107 $cm^{-3}$, or below about $10^{16}$ $cm^{-3}$. Different ones of the third gate lines 106 may be electrically controlled in any desired combination (e.g., each third gate lines 106 may be separately electrically controlled, or some or all the third gate lines 106 may be shorted together in one or more groups, as desired).

Electrical interconnects (e.g., vias and conductive lines) may contact the first gate lines 102, second gate lines 104, and third gate lines 106 in any desired manner. For example, in some embodiments, the quantum dot device 100 may include contact vias 105 (e.g., shown in FIG. 1G), extending towards and contacting respective ones of the first gate lines 102, e.g., in a one-to-one correspondence (i.e., a different contact via 105 extends towards each of the first gate lines 102). In some such embodiments, for an individual row of the N parallel rows 132, contact vias 105 to the M parallel first gate lines 102 stacked above one another may be arranged in a staircase manner, e.g., as is shown for the three contact vias 105 enclosed within a dotted contour 107 in FIG. 1G. Furthermore, although the view of FIGS. 1A-1J illustrate various gate lines and gates provided on one side of the quantum well stack 146, double-sided implementations of the arrangement as shown in FIGS. 1A-1J are also possible, one example cross-section of which is shown in FIG. 1K.

In various embodiments, any of the first gate lines 102, second gate lines 104, third gate lines 106, gates 122, and any of the electrical interconnects to the first gate lines 102, second gate lines 104, and third gate lines 106 (e.g., contact vias 105) may include any suitable electrically conductive material or a combination of materials, e.g., any suitable metal such as copper (Cu), aluminum (Al), tungsten (W), or cobalt (Co), or metal alloys. In some embodiments, any of the first gate lines 102, second gate lines 104, third gate lines 106, gates 122, and any of the electrical interconnects to the first gate lines 102, second gate lines 104, and third gate lines 106 (e.g., contact vias 105) may include one or more superconducting materials, e.g., aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys. In some embodiments, any of the first gate lines 102, second gate lines 104, third gate lines 106, gates 122, and any of the electrical interconnects to the first gate lines 102, second gate lines 104, and third gate lines 106 (e.g., contact vias 105) may include one or more magnetic materials, such as cobalt. The insulator material 128 may include any suitable interlayer dielectric (ILD) material or a combination of materials, such as silicon oxide, carbon-doped silicon oxide, silicon carbide, silicon nitride, aluminum oxide, and/or silicon oxynitride. In various embodiments, the insulator material 128 may include a low-k dielectric material. Examples of the low-k dielectric materials that may be used as the insulator material 128 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the insulator material 128 include organic polymers such as polyimide, polynorbornenes, benzocyclobutene, perfluorocyclobutane, or polytetrafluoroethylene (PTFE). Still other examples of low-k dielectric materials that may be used as the insulator material 128 include silicon-based polymeric dielectrics such as hydrogen silsesquioxane (HSQ) and methylsilsesquioxane (MSQ). Other examples of low-k materials that may be used in the insulator material 128 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

Although FIG. 1 illustrates a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of various gate lines are discussed below with reference to FIGS. 2-4. Furthermore, although FIGS. 1-4 illustrate all of the first gate lines 102, second gate lines 104, and third gate lines 106 being disposed over the same face of the quantum well stack 146, in other embodiments, some or all of the first gate lines 102, second gate lines 104, and third gate lines 106 (as well as the associated electrical interconnects thereto, and the gates 122) may be disposed over the other face of the quantum well stack 146. Yet in other embodiments, one set of the first gate lines 102, second gate lines 104, and third gate lines 106 as described herein may be disposed over one face of the quantum well stack 146, and a similar set may be disposed over the opposite face of the quantum well stack 146, thus realizing a double-sided quantum dot device 100.

Figure 2A:
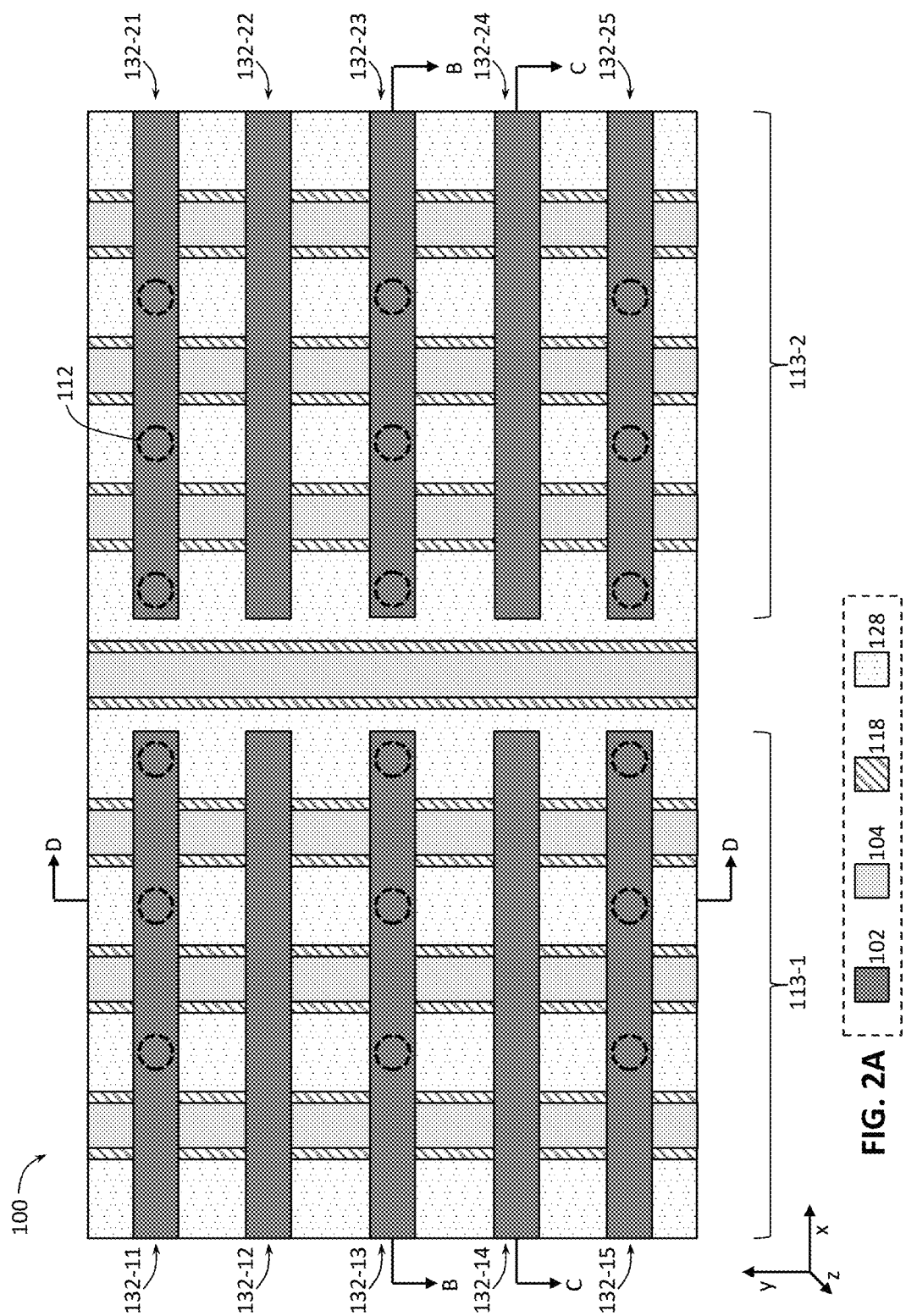
FIGS. 2A-2D are various views of a quantum dot device with independent gate control, according to a second set of embodiments of the present disclosure.
Figure 2B:
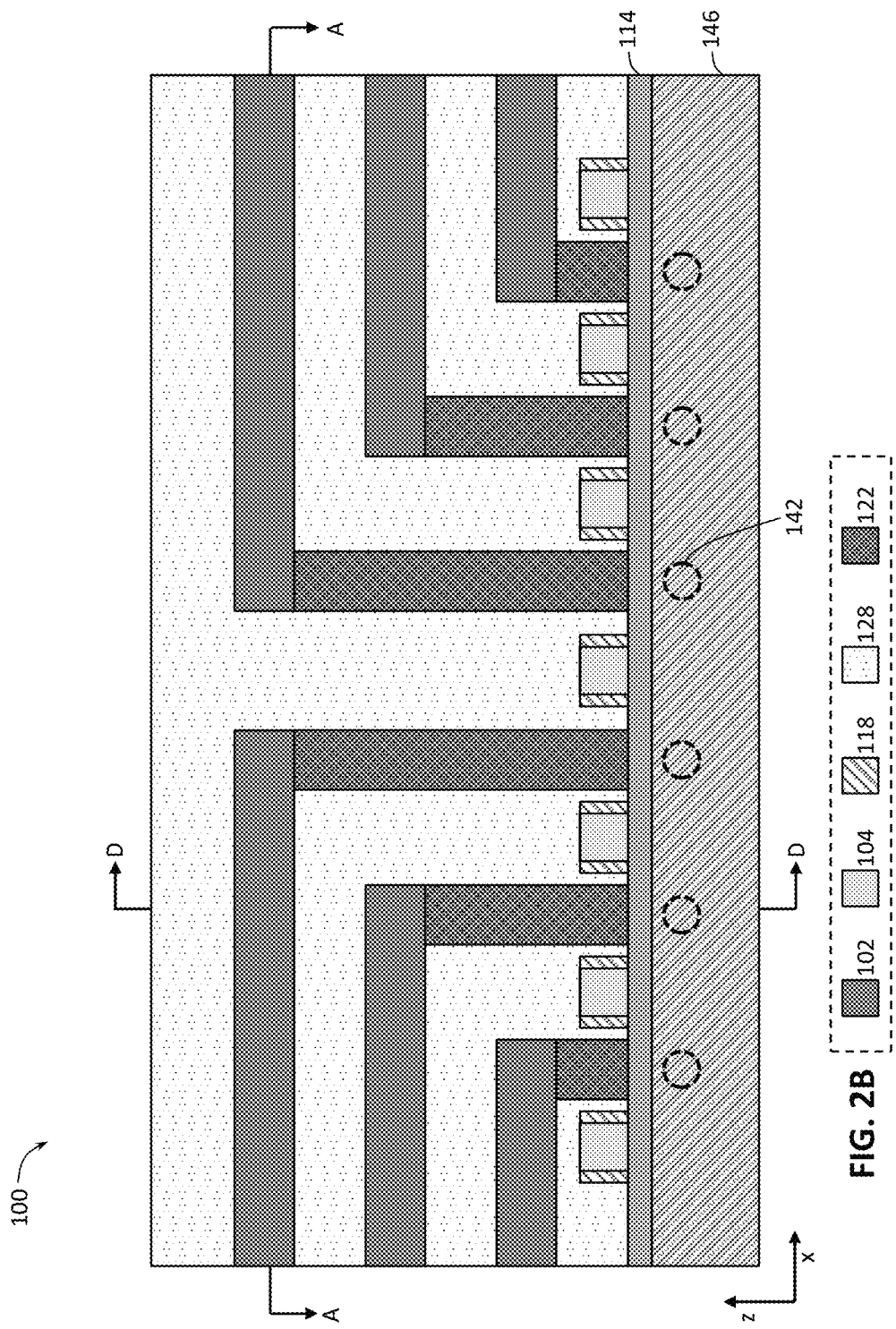
Figure 2C:
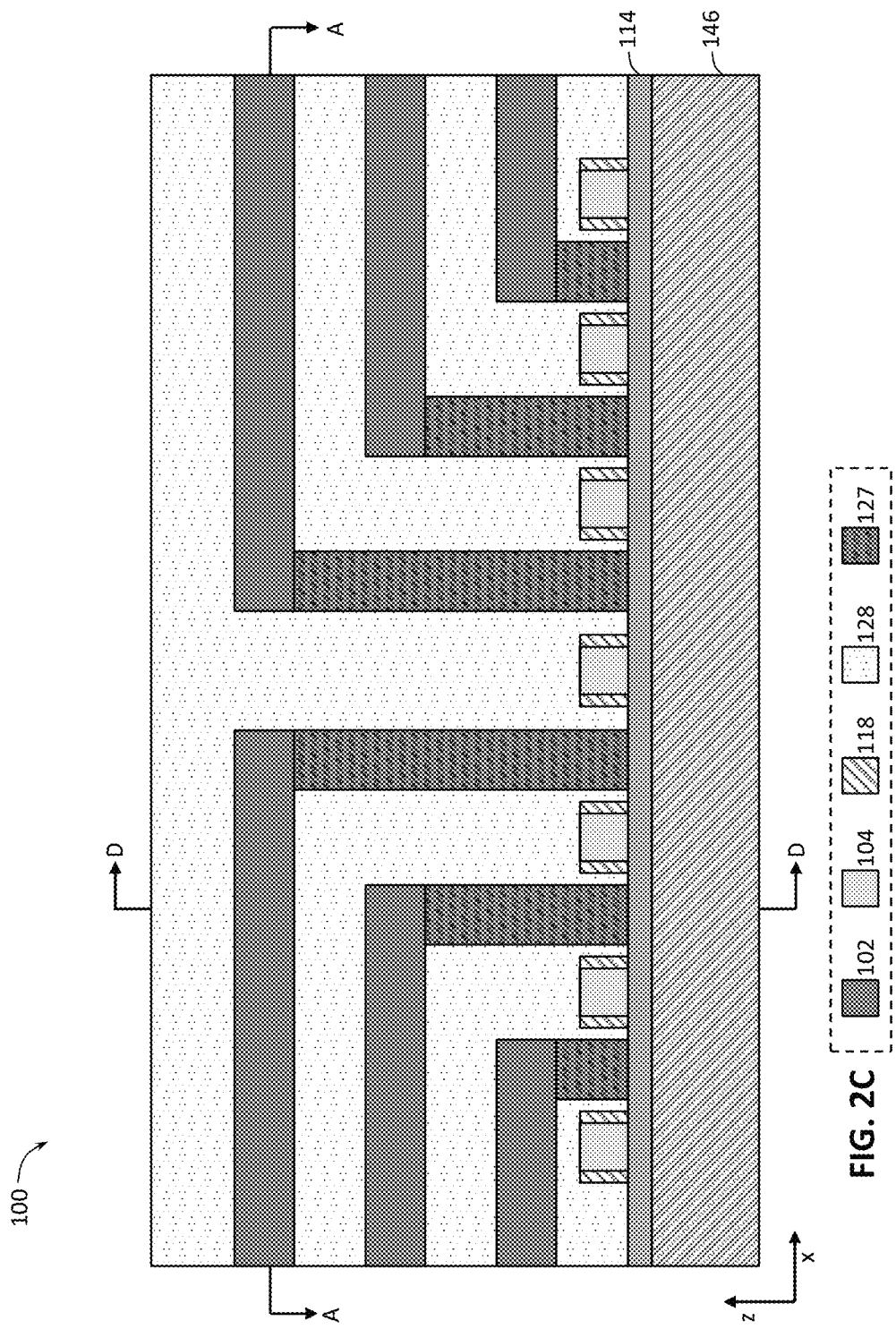
Figure 2D:
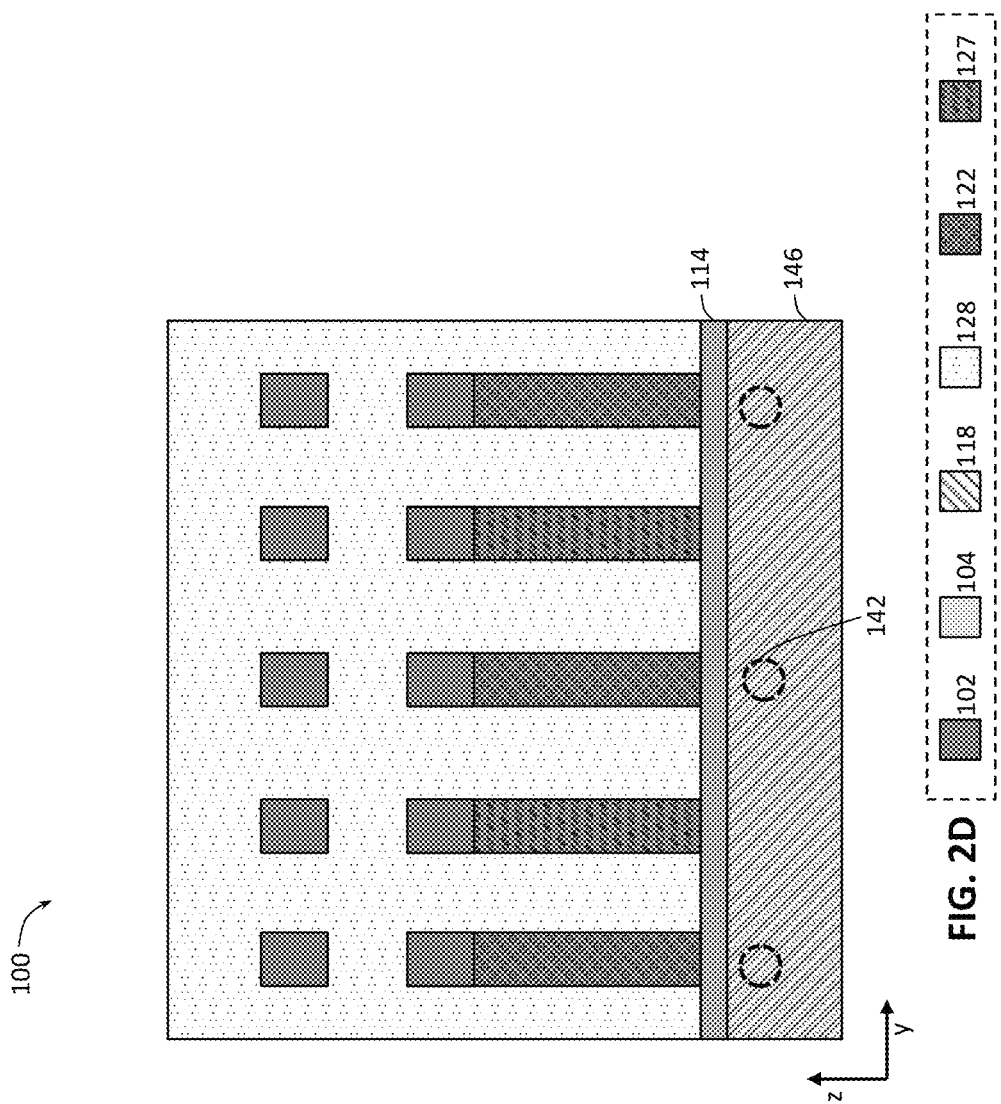

FIGS. 2A-2D are various views of a quantum dot device 100 with independent gate control, according to a second set of embodiments of the present disclosure. Similar to FIG. 1A, FIG. 2A is a top view of a portion of the quantum dot device 100 with some of the materials removed so that first gate lines 102 and second gate lines 104 are visible; FIG. 2B is a view through the section B-B of FIG. 2A (a cross-section across the same plane as that shown in FIG. 1B), FIG. 2C is a view through the section C-C of FIG. 2A (a cross-section across a different plane parallel to that as that shown in FIG. 2B), FIG. 2D is a view through the section D-D of FIGS. 2A-2C (a cross-section across the same plane as that shown in FIG. 1F), and FIG. 2A is a view through the section A-A of FIG. 2B (a cross-section across the same plane as that shown in FIG. 1A). Although the views of FIG. 2 illustrate various gate lines and gates provided on one side of the quantum well stack 146, double-sided implementations of the arrangement as shown in FIG. 2 are also possible and within the scope of the present disclosure, e.g., similar to the double-sided example cross-section shown in FIG. 1K.

The quantum dot device 100 shown in FIG. 2 is similar to that of FIG. 1 and, therefore, all of the descriptions provided with reference to FIG. 1 are applicable to FIG. 2, except for the differences that will now be described. Similarities and differences between the quantum dot device 100 shown in FIG. 2 and that shown in FIG. 1 may be identified by comparing the views of FIG. 2A and FIG. 1A, by comparing the views of FIG. 2C and FIG. 1B, and by comparing the views of FIG. 2D and FIG. 1F. Other cross-sections shown in FIG. 1 which are not shown in FIG. 2 may be easily derived for the embodiments of the quantum dot device 100 of FIG. 2 from the illustrations that are provided in FIG. 2 and the descriptions provided herein. In particular, the arrangement of various gate lines in the quantum device 100 of FIG. 2 may be the same as that shown in FIG. 1, except for how the gate lines may be used (i.e., signals applied to these gate lines may be different signals, serving different purposes, e.g., to drive some gate lines as plunger gate lines while driving other gate lines as barrier gate lines). In particular, in the quantum device 100 of FIG. 2 some of the first gate lines 102 may be used as barrier gate lines instead of all of them being used as plunger gate lines in the quantum device 100 of FIG. 1. The latter is shown in FIG. 1 by showing a row of quantum dots 142 under each of the N rows 132 of the first gate lines 102, while the former is shown in FIG. 2 by showing rows of quantum dots 142 only under some of the N rows 132 of the first gate lines 102 (i.e., those rows 132 include plunger gate lines), while the first gate lines 102 of the other ones of the rows 132 may be used as barrier gate lines. In particular, FIG. 2 illustrates that, in some embodiments, the first gate lines 102 of different rows 132 may be used in alternation as plunger and barrier gate lines. For example, as shown in FIG. 2, the first gate lines 102 of rows 132-11, 132-13, and 132-15 of the first array 113-1, and the corresponding rows on the other side of the quantum dot device 100 (i.e., rows 132-21, 132-23, and 132-25) may be used as plunger gate lines (i.e., gate lines from which the gates 122 extend under which the quantum dots 142 may be formed in the quantum well stack 146), while the first gate lines 102 of rows 132-12 and 132-14, and the corresponding rows of the second array 113-2 of the quantum dot device 100 (i.e., rows 132-22 and 132-24) may be used as barrier gate lines. In FIG. 2, the same patterns as those used to illustrate the gates 122 in FIG. 1 are only shown to illustrate gates which are the same as the gates 122 of FIG. 1 but extending from the first gate lines 102 that serve as plunger gate lines. To differentiate between the functionality of barrier gates, FIG. 2 uses a different pattern, and a reference numeral "127" (e.g., see FIG. 2C) to illustrate gates which are the same as the gates 122 of FIG. 1 but extending from the first gate lines 102 that serve as barrier gate lines. Thus in FIG. 2, the gates 122 are the plunger gates as in FIG. 1, while the gates 127 are barrier gates, under which no quantum dots are formed. Using some rows 132 of the first gate lines 102 as barrier gate lines between adjacent rows 132 of the first gate lines 102 used as plunger gate lines may be advantageous in terms of improving electrostatics of the quantum dot device 100 and enabling a more precise control of the quantum dot formation in the quantum well stack 146. In some implementations, the gates 127 may provide means to control coupling between quantum dots from adjacent arrays 113, thus further improving control of the quantum dot electrostatics.

Figure 3A:
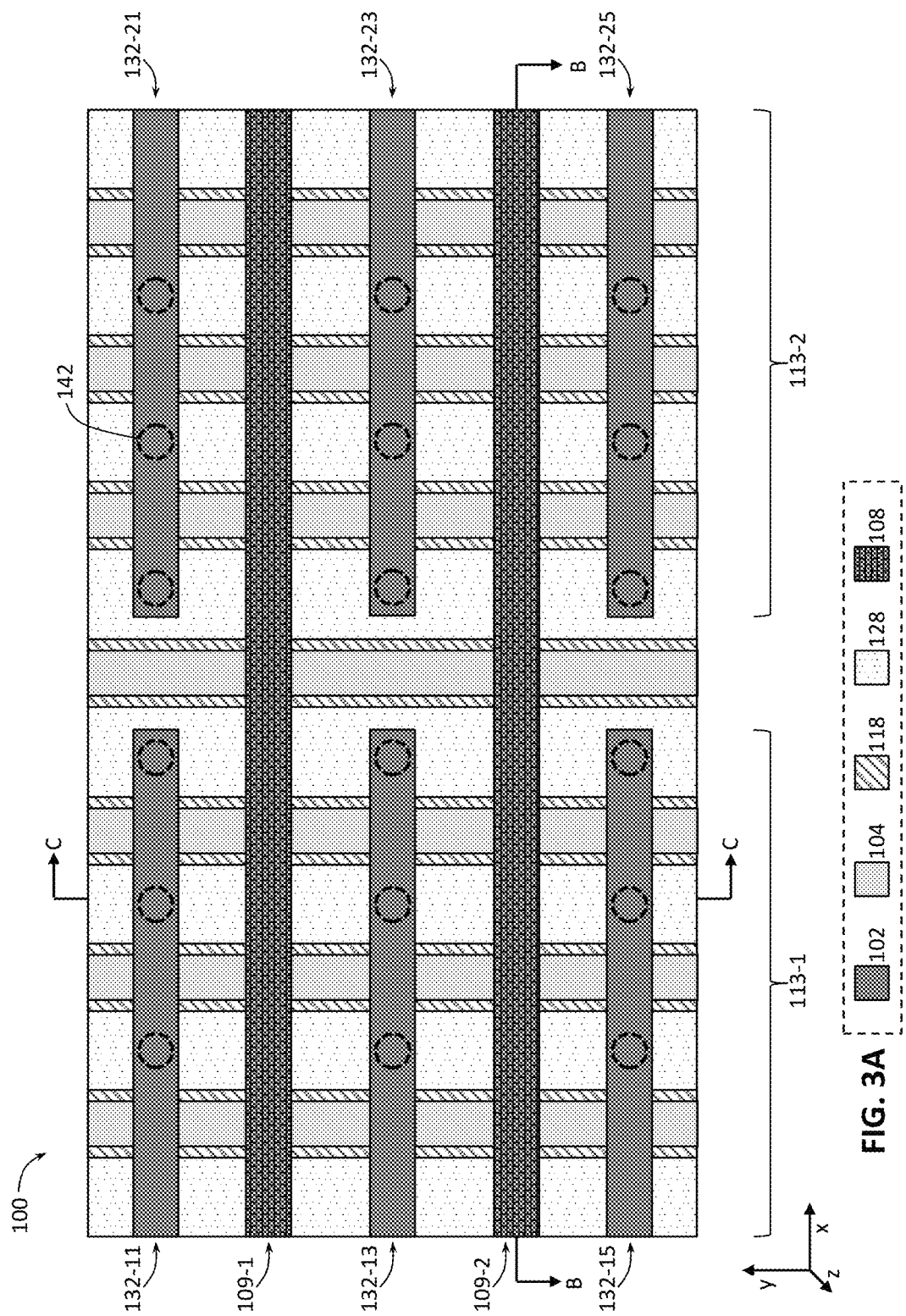
FIGS. 3A-3C are various views of a quantum dot device with independent gate control, according to a third set of embodiments of the present disclosure.
Figure 3B:
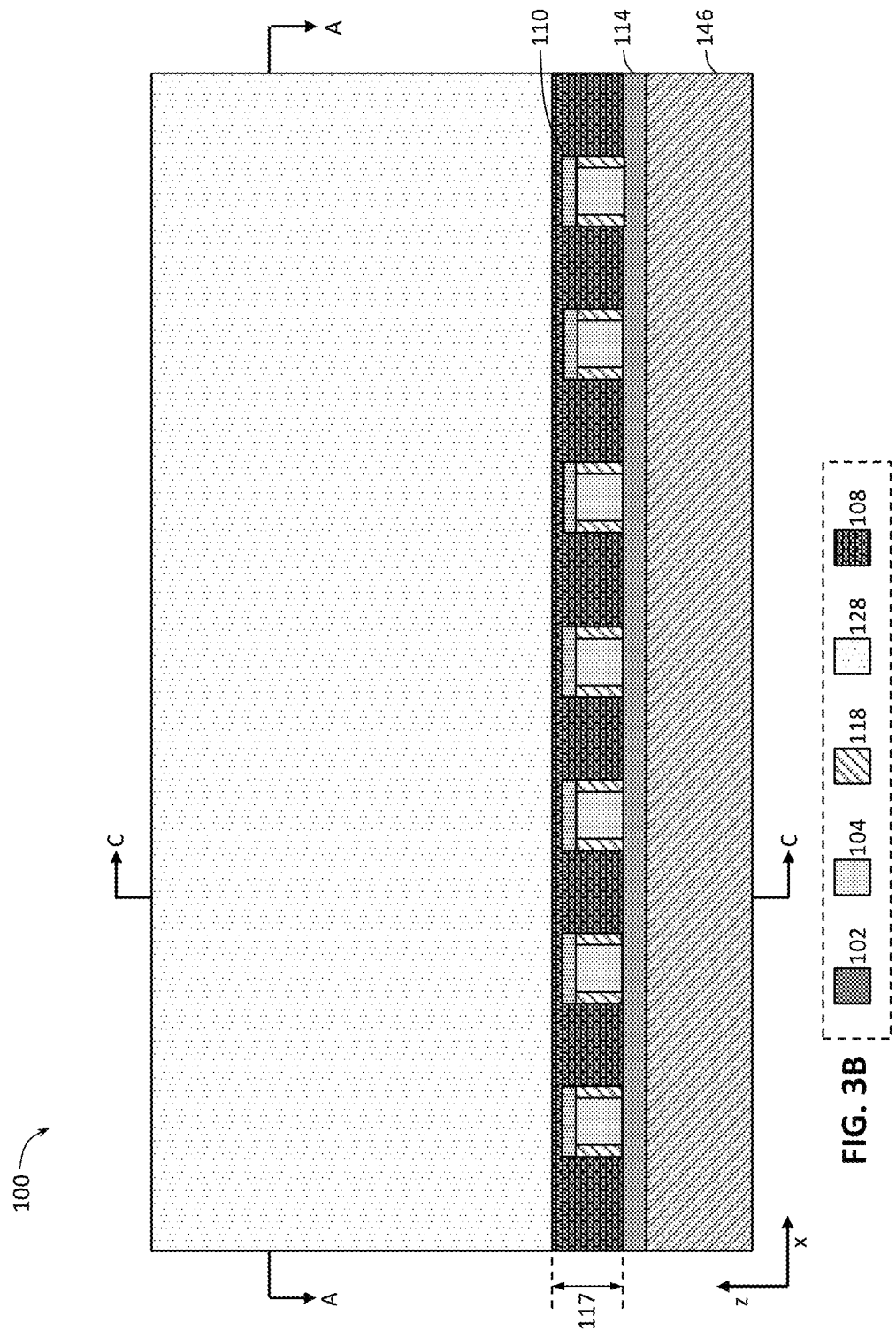
Figure 3C:
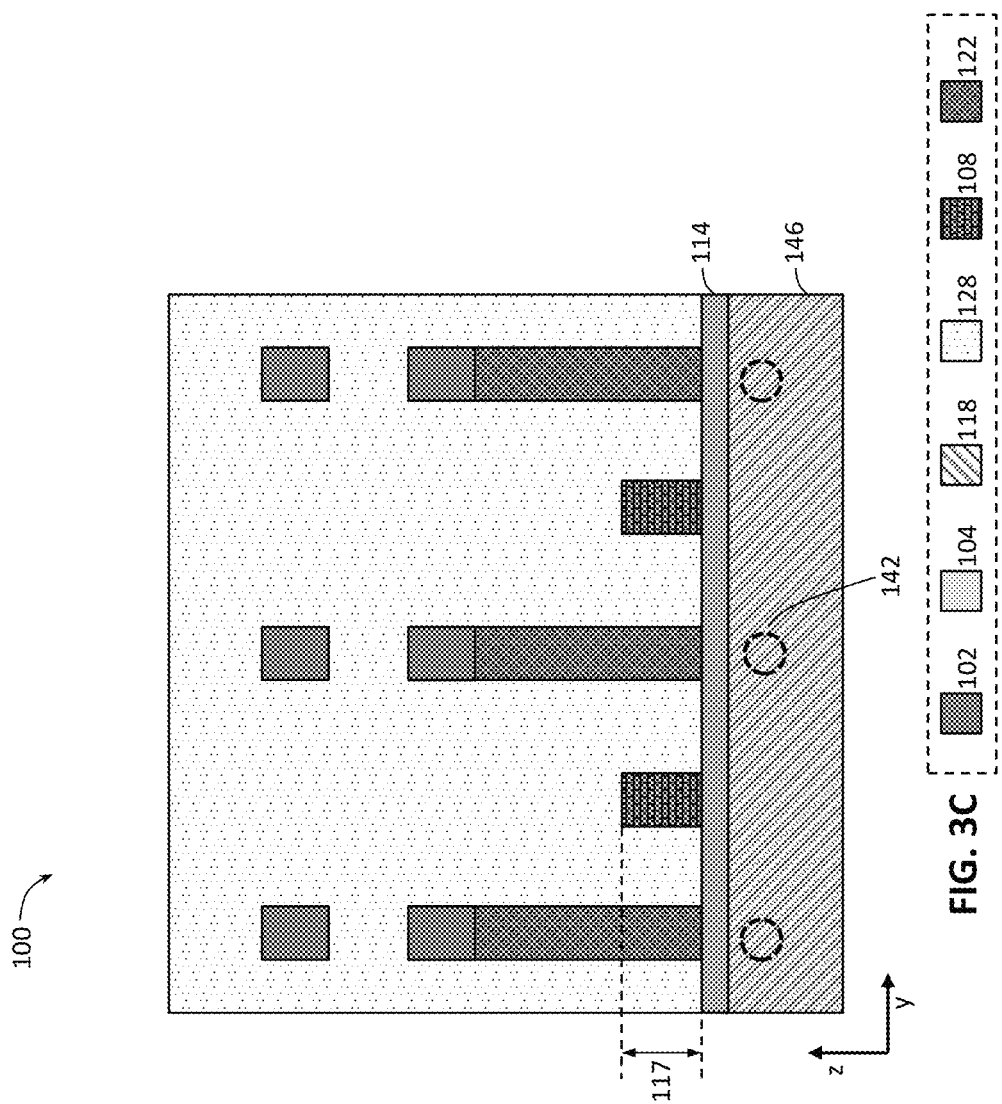

FIGS. 3A-3C are various views of a quantum dot device 100 with independent gate control, according to a third set of embodiments of the present disclosure. Similar to FIG. 1A, FIG. 3A is a top view of a portion of the quantum dot device 100 with some of the materials removed so that first gate lines 102 and second gate lines 104 are visible; FIG. 3B is a view through the section B-B of FIG. 3A (a cross-section across the same plane as that shown in FIG. 1B), FIG. 3C is a view through the section C-C of FIG. 3A (a cross-section across the same plane as that shown in FIG. 1F), and FIG. 3A is a view through the section A-A of FIG. 3B (a cross-section across the same plane as that shown in FIG. 1A). Although the views of FIG. 3 illustrate various gate lines and gates provided on one side of the quantum well stack 146, double-sided implementations of the arrangement as shown in FIG. 3 are also possible and within the scope of the present disclosure, e.g., similar to the double-sided example cross-section shown in FIG. 1K.

The quantum dot device 100 shown in FIG. 3 is similar to that of FIG. 1 and, therefore, all of the descriptions provided with reference to FIG. 1 are applicable to FIG. 3, except for the differences that will now be described. Similarities and differences between the quantum dot device 100 shown in FIG. 3 and that shown in FIG. 1 may be identified by comparing the views of FIG. 3A and FIG. 1A, by comparing the views of FIG. 3B and FIG. 1B, and by comparing the views of FIG. 3C and FIG. 1F. Other cross-sections shown in FIG. 1 which are not shown in FIG. 3 may be easily derived for the embodiments of the quantum dot device 100 of FIG. 3 from the illustrations that are provided in FIG. 3 and the descriptions provided herein. In particular, the arrangement of the second gate lines 104 and of some of the first gate lines 102 in the quantum device 100 of FIG. 3 may be the same as that shown in FIG. 1, except that the other ones of the first gate lines 102 of FIG. 1 may be replaced with fourth gate lines 108 that may be provided on or over the gate dielectric 114 and may extend across the two arrays 113 of the quantum dot device 100. In particular, in the quantum device 100 of FIG. 3 some rows 132 of the first gate lines 102 are still used as plunger gate lines as described for the quantum device 100 of FIG. 1, while other rows 132 (e.g., in an alternating fashion with the plunger gate lines) may be replaced with the respective fourth gate lines 108 that may be used as screening gates. The latter is shown in FIG. 3 by showing rows of quantum dots 142 only under some of the N rows 132 of the first gate lines 102 (i.e., those rows 132 include plunger gate lines), while the first gate lines 102 of the other ones of the rows 132 are replaced with fourth gate lines 108. In particular, FIG. 3 illustrates that, in some embodiments, the first gate lines 102 of different rows 132 may be used as plunger gates in alternation with screening gates provided by the fourth gate lines 108. For example, as shown in FIG. 3, the first gate lines 102 of rows 132-11, 132-13, and 132-15 of the first array 113-1, and the corresponding rows of the second array 113-2 of the quantum dot device 100 (i.e., rows 132-21, 132-23, and 132-25) may be used as plunger gate lines (i.e., gate lines from which the gates 122 extend under which the quantum dots 142 may be formed in the quantum well stack 146), while the first gate lines 102 of what used to be rows 132-12 and 132-14 of both the first and second arrays 113 are replaced with fourth gate lines 108 that extend substantially parallel to the rows 132 of the first gate lines, across both arrays 113. Thus, in some embodiments, the fourth gate lines 108 may extend in parallel rows 109 (i.e., different fourth gate lines 108 may be parallel to one another), where each row 109 includes a single fourth gate line 108 that extends across the first and second arrays 113, where an individual fourth gate line 108 may be provided between a pair of adjacent rows 132 of the first gate lines 102, and where the rows 109 may be parallel to the rows 132. For example, as shown in FIG. 3, a first row 109-1 may include a first instance of the fourth gate line 108, provided between a pair of adjacent rows 132-11 and 132-13 in the portion of the first array 113-1 of the quantum dot device 100, and extending further into the portion of the second array 113-2 of the quantum dot device 100, where that instance of the fourth gate line 108 is provided between a pair of adjacent rows 132-21 and 132-23. Similarly, a second row 109-2 may include a second instance of the fourth gate line 108, provided between a pair of adjacent rows 132-13 and 132-15 in the portion of the first array 113-1 of the quantum dot device 100, and extending further into the portion of the second array 113-2 of the quantum dot device 100, where that instance of the fourth gate line 108 is provided between a pair of adjacent rows 132-23 and 132-25. The fourth gate lines 108 may be used as screening gates to improve electrostatics of the quantum dot device 100 and enable a more precise control of the quantum dot formation in the quantum well stack 146. In some implementations, gates formed by the fourth gate lines 108 may provide means to control coupling between quantum dots from adjacent arrays 113, thus further improving control of the quantum dot electrostatics.

The height of the fourth gate lines 108 (i.e., a dimension measured in a direction perpendicular to the quantum well stack 146, e.g., along the z-axis of the example coordinate system shown) may be of any suitable value for the fourth gate lines 108 to support signals applied thereto in order to serve as screening gates. In some embodiments, the height of the fourth gate lines 108 may be greater than the height of the second gate lines 104, and each instance of the fourth gate lines 108 may cross over multiple parallel second gate lines 104, e.g., as is shown in FIG. 3B. For example, in some embodiments, a height 117 (e.g., labeled in FIG. 3B and FIG. 3C) of the fourth gate lines 108 may be between about 10 and 200 nanometers, including all values and ranges therein, e.g., between about 20 and 100 nanometers, or between about 25 and 50 nanometers. The electrically conductive materials of the fourth gate lines 108 may be electrically isolated from those of the second gate lines 104, e.g., by virtue of the spacer material 118 and the hardmask 110, as shown in FIG. 3B.

Figure 4A:
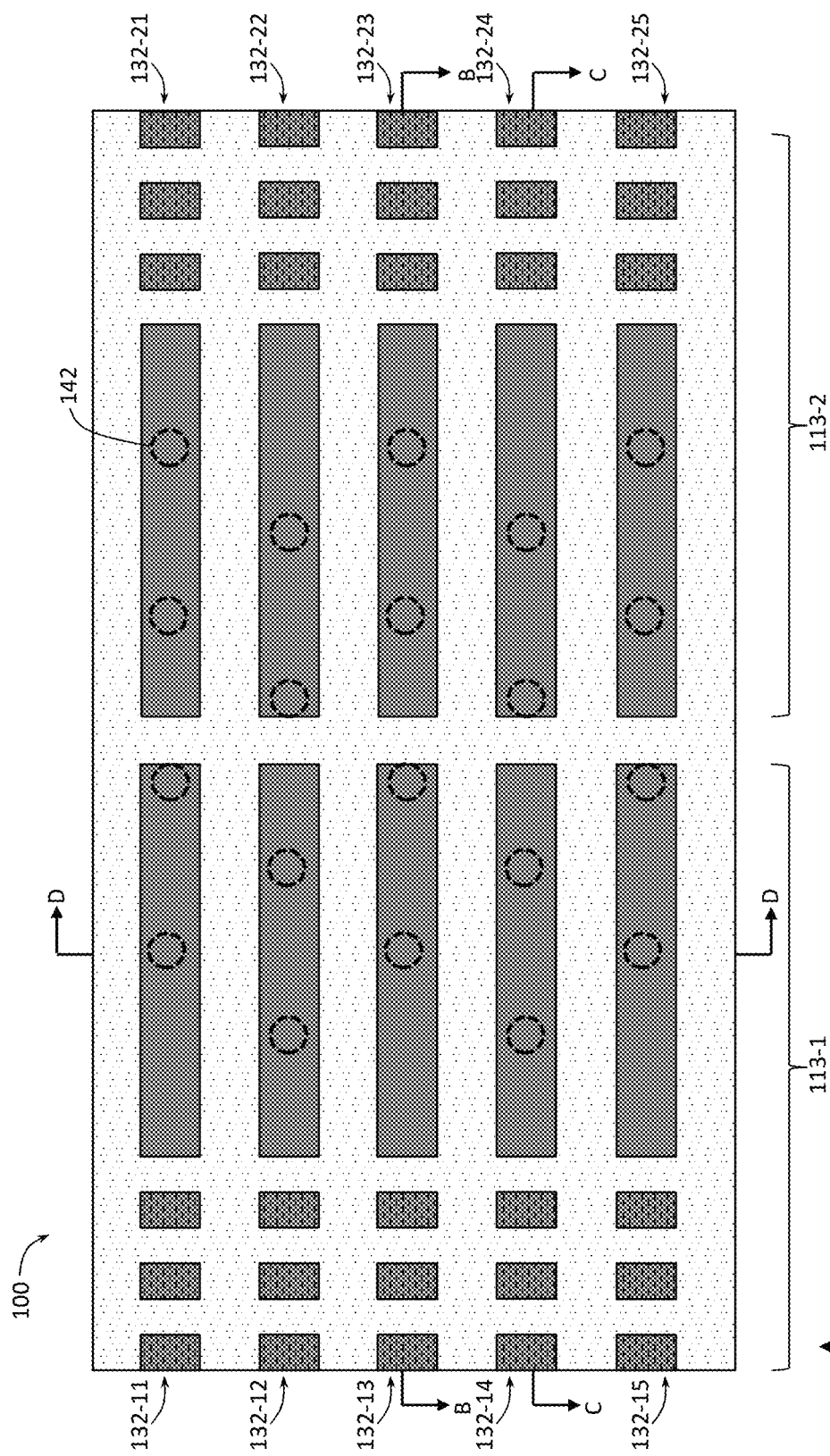
FIGS. 4A-4E are various views of a quantum dot device with independent gate control, according to a fourth set of embodiments of the present disclosure.
Figure 4B:
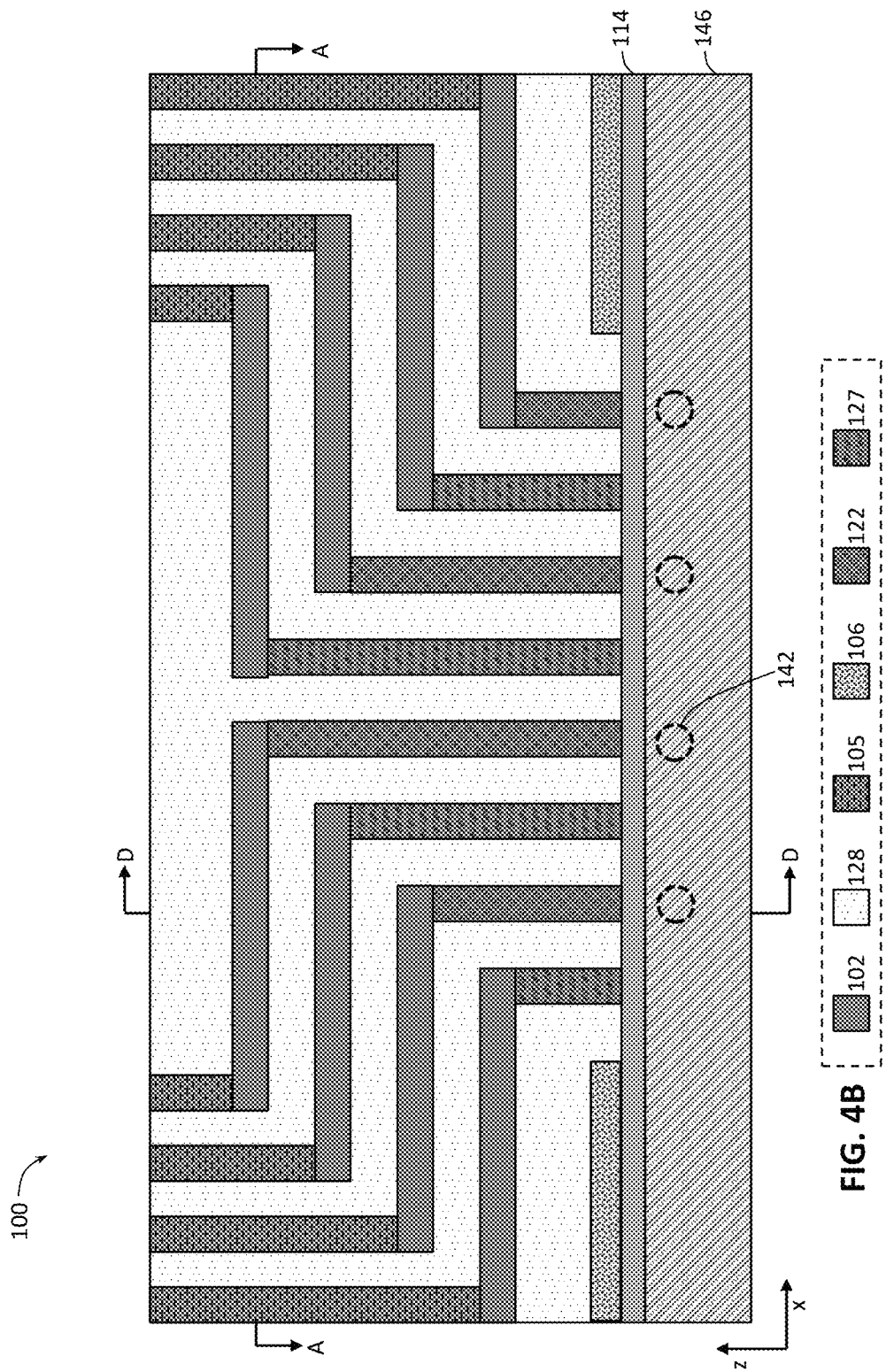
Figure 4C:
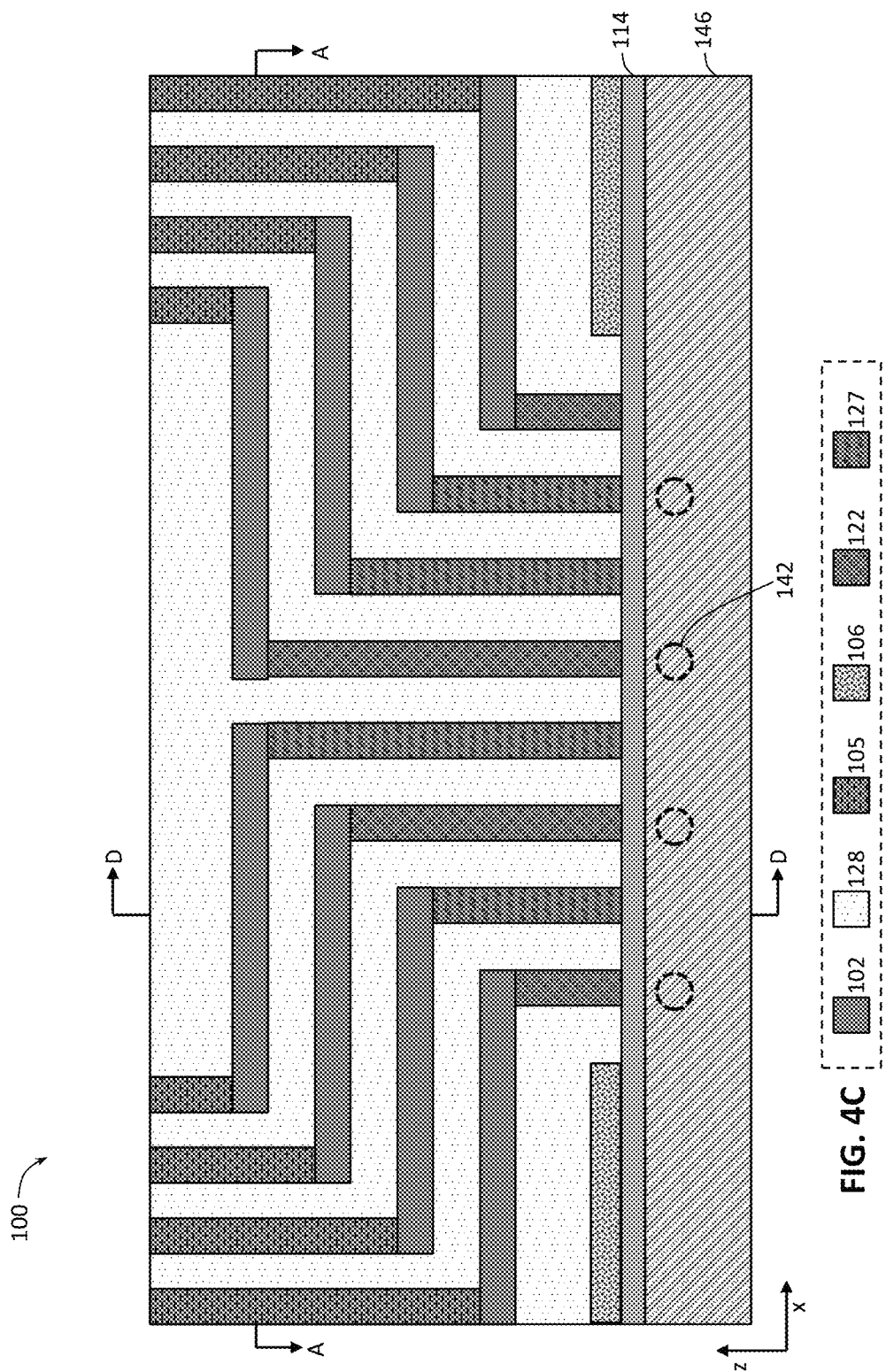
Figure 4D:
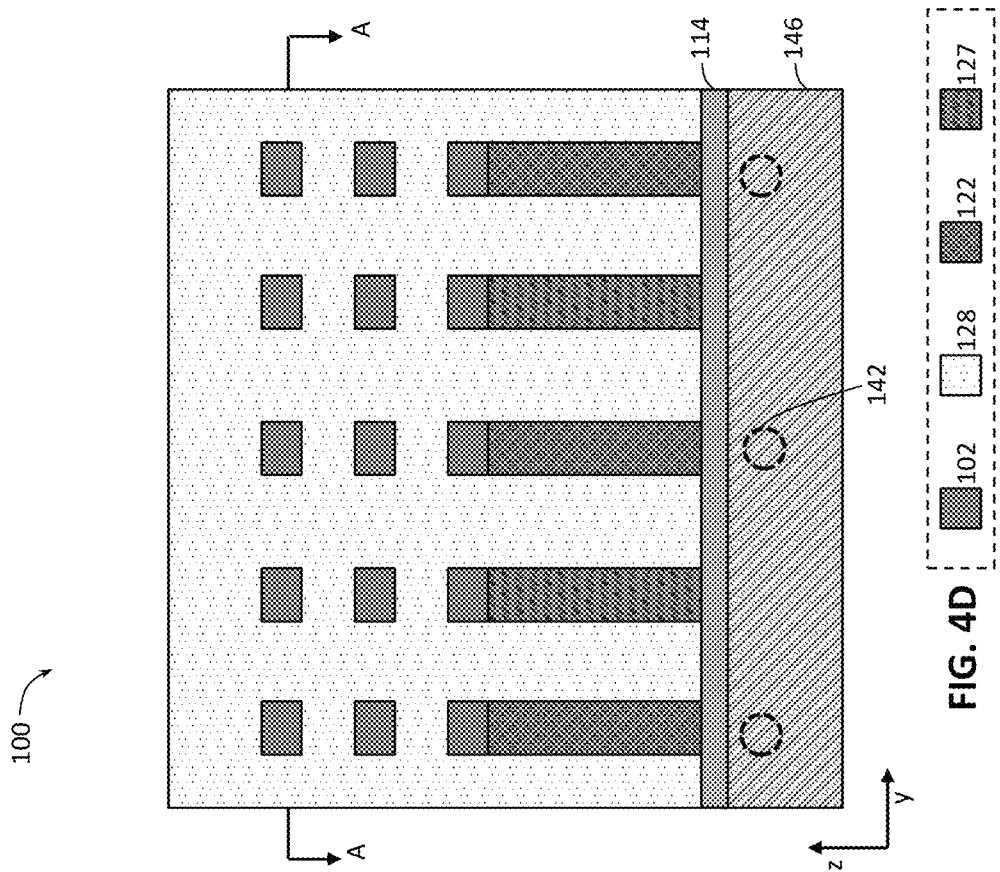
Figure 4E:
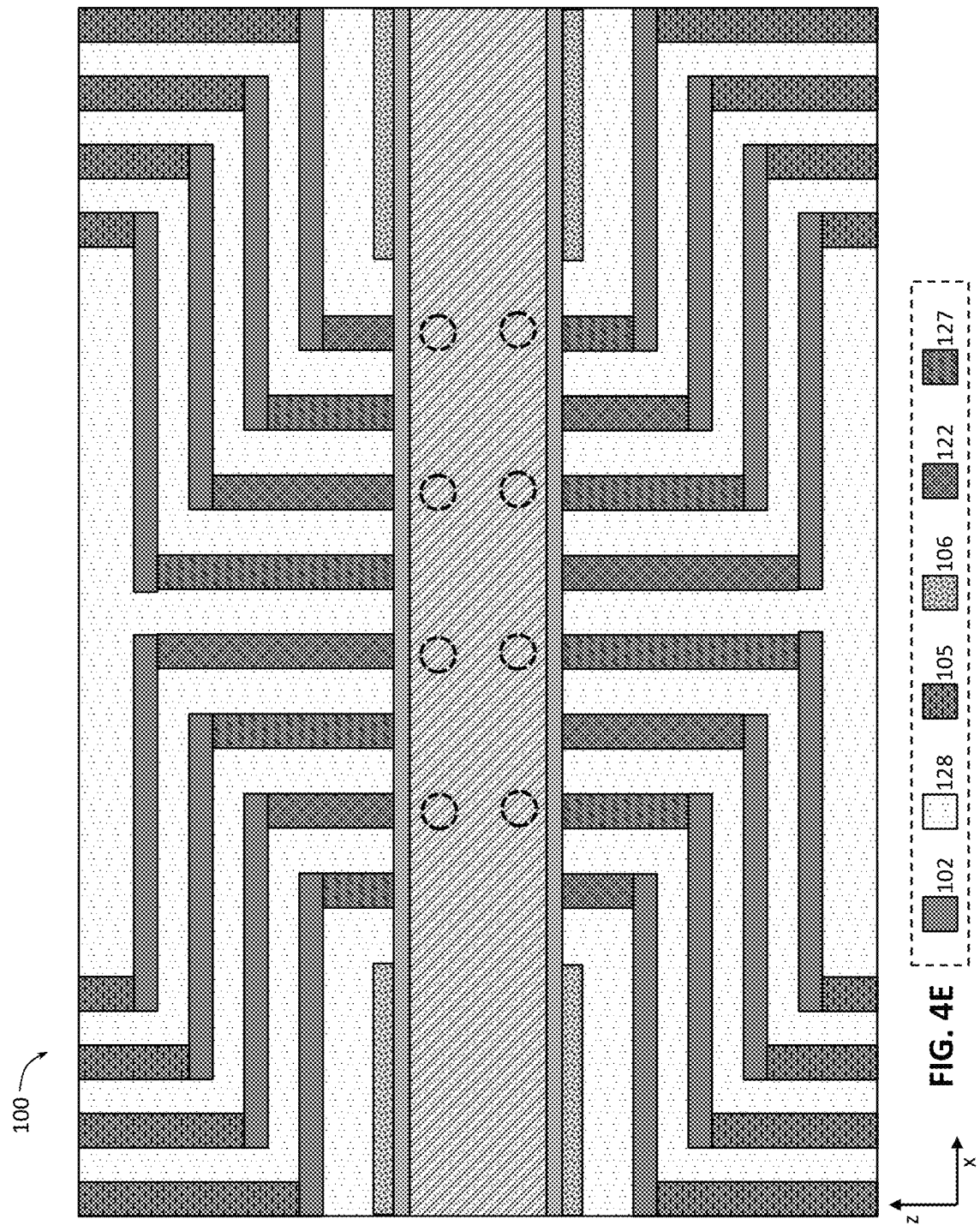

FIGS. 4A-4E are various views of a quantum dot device 100 with independent gate control, according to a fourth set of embodiments of the present disclosure. Similar to FIG. 1A, FIG. 4A is a top view of a portion of the quantum dot device 100 with some of the materials removed so that the first gate lines 102 and the contact vias 105 are visible; FIG. 4B is a view through the section B-B of FIG. 4A (a cross-section across a plane similar to that shown in FIG. 1B), FIG. 4C is a view through the section C-C of FIG. 4A (a cross-section across a different plane parallel to that as that shown in FIG. 4B), FIG. 4D is a view through the section D-D of FIGS. 4A-4C (a cross-section across a plane similar to that shown in FIG. 1F), and FIG. 4A is a view through the section A-A of FIGS. 4B-4C (a cross-section across the same plane as that shown in FIG. 1A). FIG. 4E is a cross-sectional side view similar to that of FIG. 4B, but illustrating a double-sided embodiment of the quantum dot device 100.

The quantum dot device 100 shown in FIG. 4 is similar to that of FIG. 2 and, therefore, all of the descriptions provided with reference to FIG. 2 are applicable to FIG. 4, except for the differences that will now be described. In particular, in the quantum dot device 100 shown in FIG. 2, entire rows 132 of the first gate lines 102 that used to be operated as plunger gate lines were driven as barrier gate lines instead, with the notation of the gates 122 being used to show the gates 122 as in FIG. 1 but extending from the first gate lines 102 that are operated as plunger gate lines, and with the notation of the gates 127 being used to show the gates 127 as in FIG. 1 but extending from the first gate lines 102 that are operated as barrier gate lines. In FIG. 4, this notation of the plunger gates 122 and the barrier gates 127 as in FIG. 2 is maintained. The difference in FIG. 4 is that it illustrates an embodiments where four parallel stacked first gate lines 102 is implemented in each of the rows 132 (i.e., M=4) and that the parallel stacked first gate lines 102 within a single row 132 are used, in alternation, as plunger gate lines (i.e., from which the gates 122 extend under which the quantum dots 142 may be formed) and barrier gate lines (i.e., from which the gates 127 extend).

Although the views of FIGS. 4A-4D illustrate various gate lines and gates provided on one side of the quantum well stack 146, double-sided implementations of the arrangement as shown in FIGS. 4A-4D are also possible, one example cross-section of which is shown in FIG. 4E.

Figure 5A:
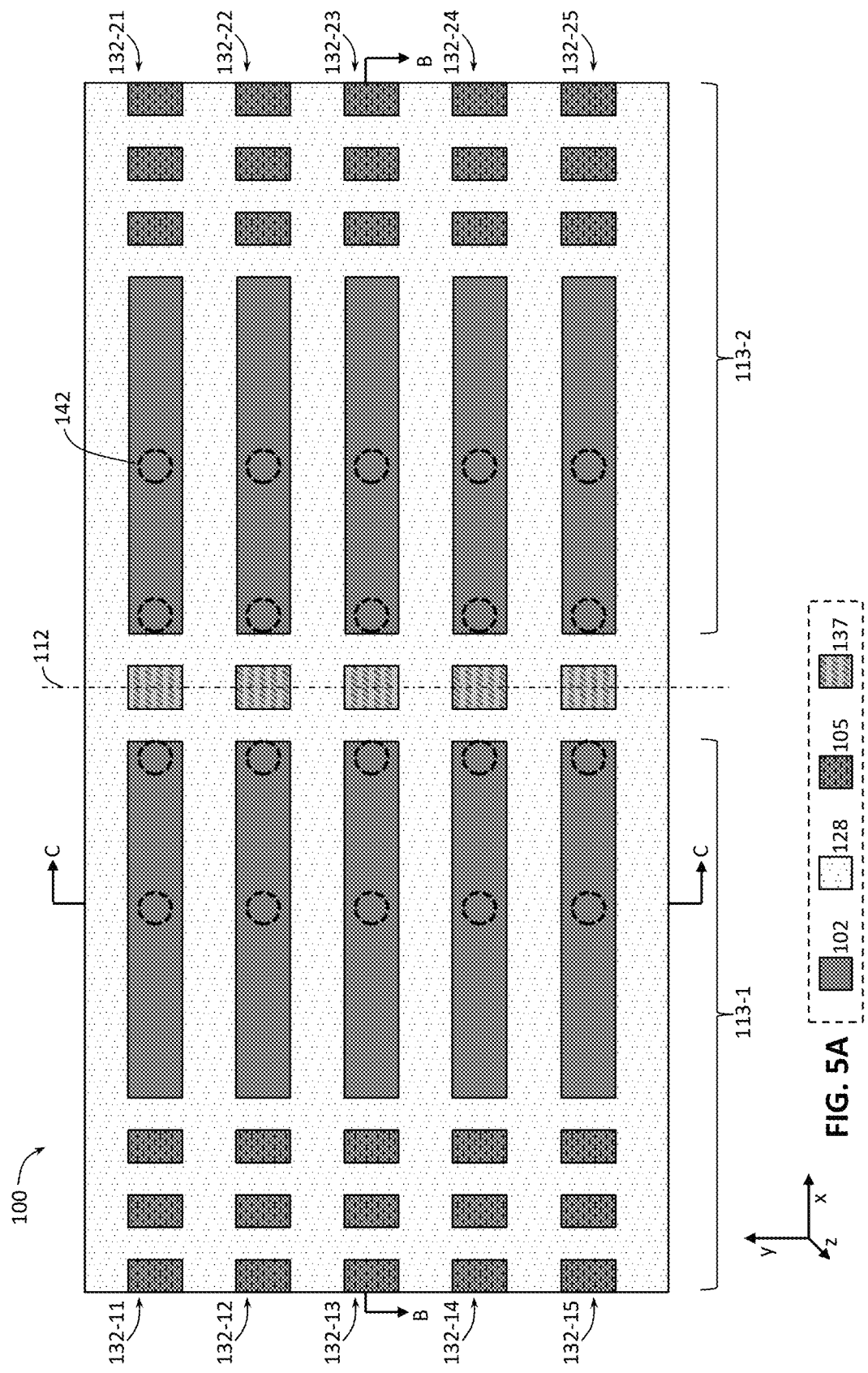
FIGS. 5A-5D are various views of a quantum dot device with independent gate control, according to a fifth set of embodiments of the present disclosure.
Figure 5B:
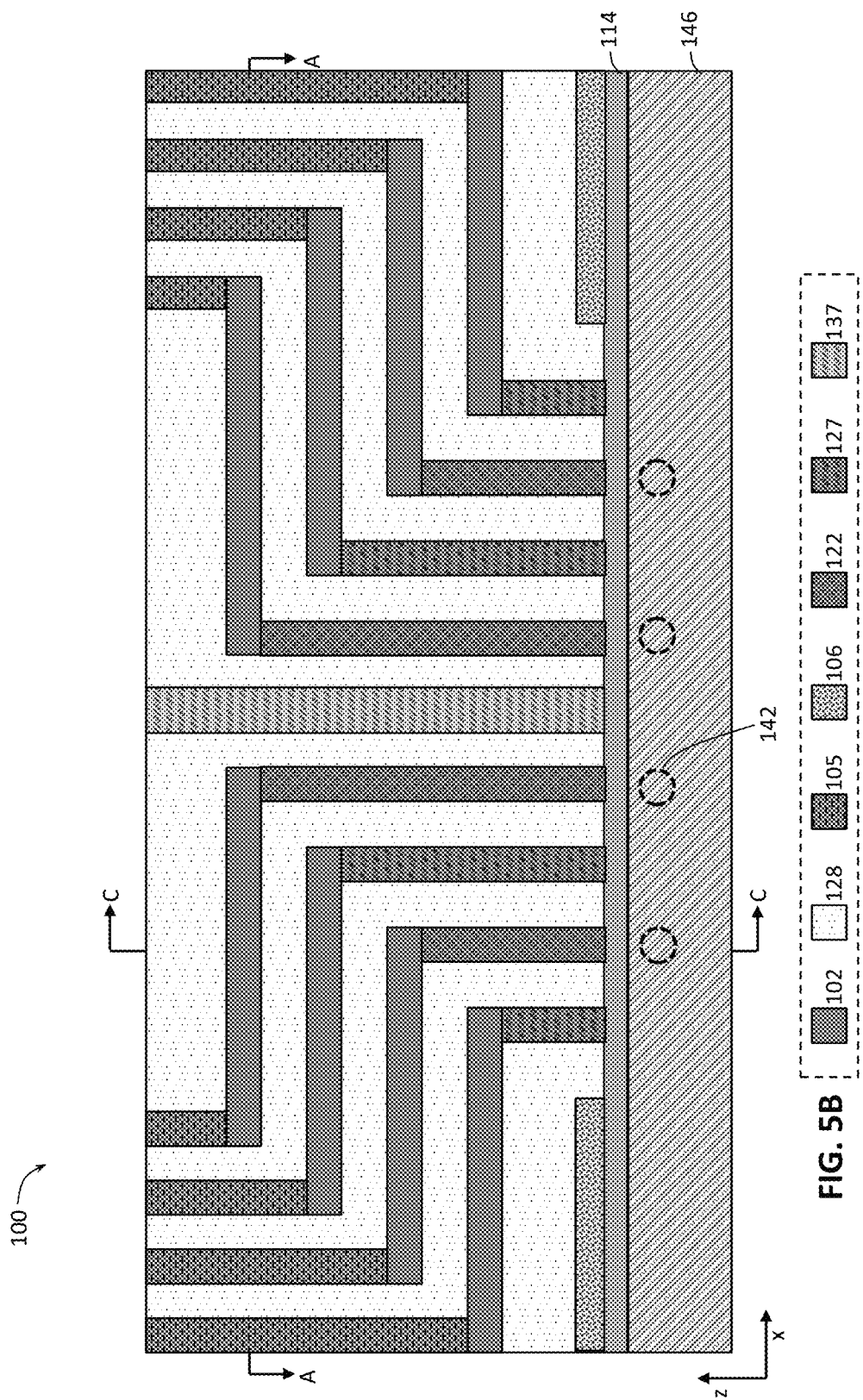
Figure 5C:
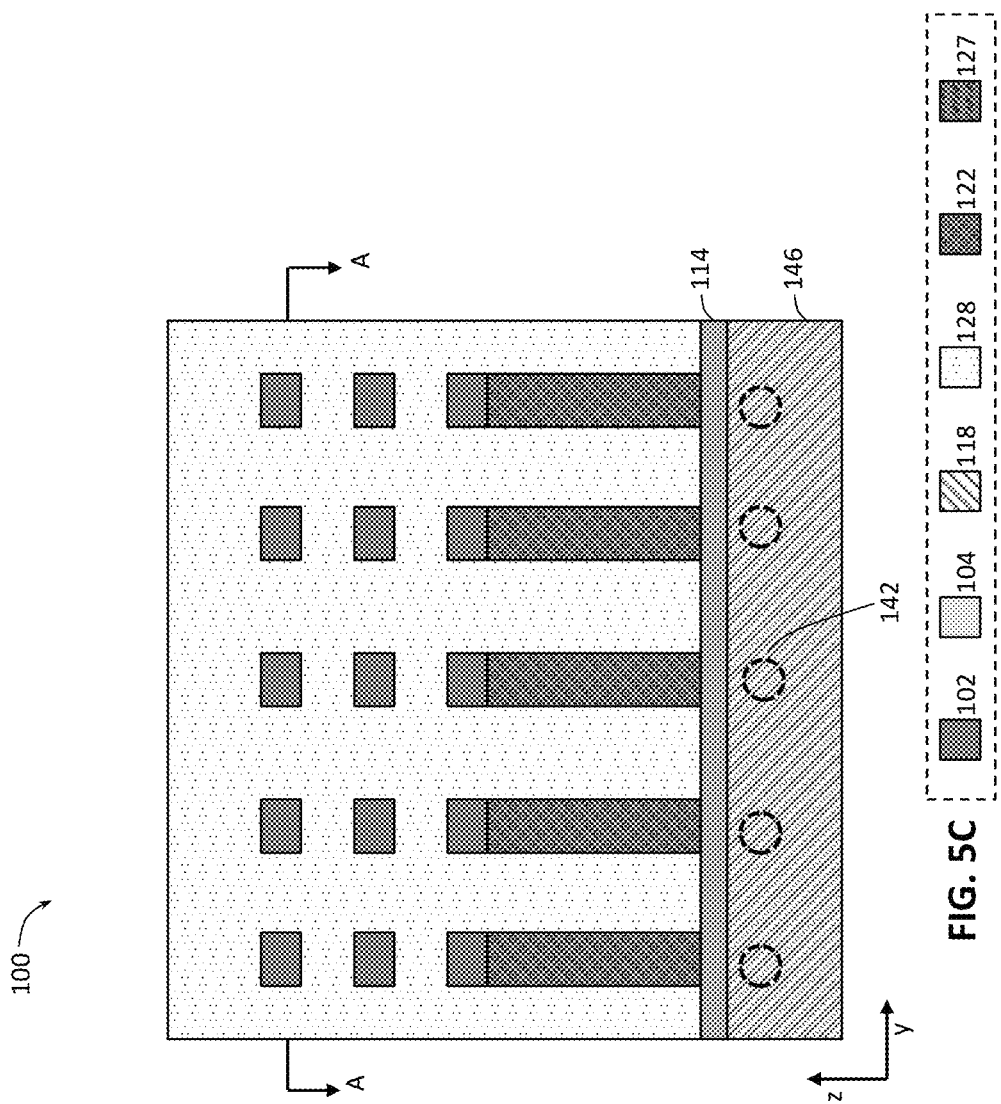
Figure 5D:
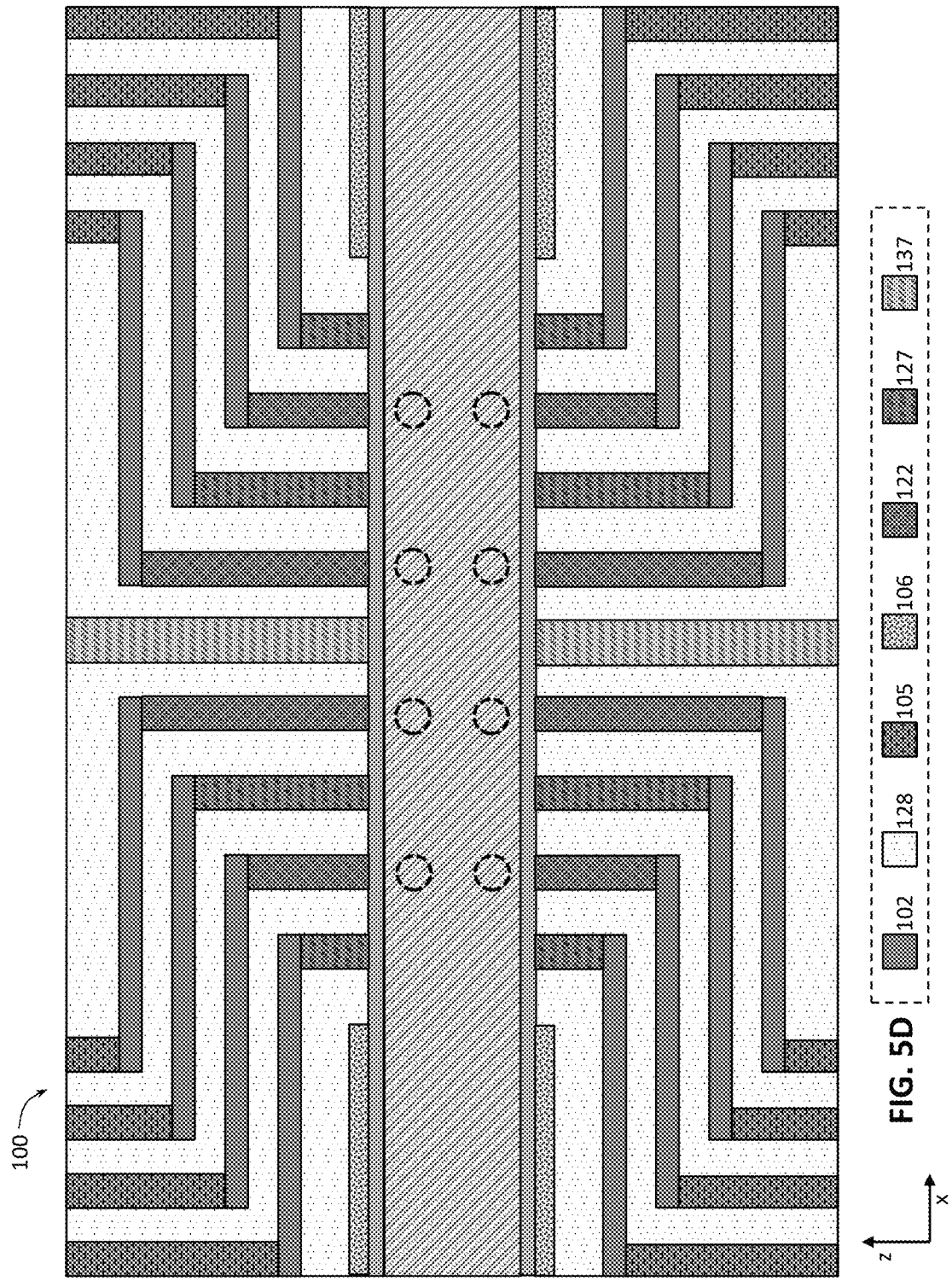

FIGS. 5A-5D are various views of a quantum dot device 100 with independent gate control, according to a fifth set of embodiments of the present disclosure. Similar to FIG. 1A, FIG. 5A is a top view of a portion of the quantum dot device 100 with some of the materials removed so that the first gate lines 102, the contact vias 105, and center gates 137 are visible; FIG. 5B is a view through the section B-B of FIG. 5A (a cross-section across a plane similar to that shown in FIG. 1B), FIG. 5C is a view through the section C-C of FIGS. 5A-5B (a cross-section across a plane similar to that shown in FIG. 1F or FIG. 4D), and FIG. 5A is a view through the section A-A of FIGS. 5B-5C (a cross-section across the same plane as that shown in FIG. 1A). FIG. 5D is a cross-sectional side view similar to that of FIG. 5B, but illustrating a double-sided embodiment of the quantum dot device 100.

The quantum dot device 100 shown in FIG. 5 is similar to that of FIG. 4 and, therefore, all of the descriptions provided with reference to FIG. 4 are applicable to FIG. 5, except for the differences that will now be described. In particular, in the quantum dot device 100 shown in FIG. 4, the plunger gates 122 (and, therefore, the barrier gates 127) were arranged in an asymmetric manner between the first array 113-1 and the second array 113-2. In contrast, in the quantum dot device 100 shown in FIG. 5, the plunger gates 122 (and, therefore, the barrier gates 127) are arranged symmetrically manner between the first array 113-1 and the second array 113-2, e.g., symmetric with respect to the line 112. Furthermore, FIG. 5 further illustrates that, in some embodiments, center gates 137 may be provided between corresponding rows 132 of the first array 113-1 and the second array 113-2, the center gates 137 coupled to signal sources (e.g., voltage sources) to provide further control of the electrostatics associated with operating the qubits of the quantum dot device 100.

Although the views of FIGS. 5A-5C illustrate various gate lines and gates provided on one side of the quantum well stack 146, double-sided implementations of the arrangement as shown in FIGS. 5A-5C are also possible, one example cross-section of which is shown in FIG. 5D.

Figure 6A:
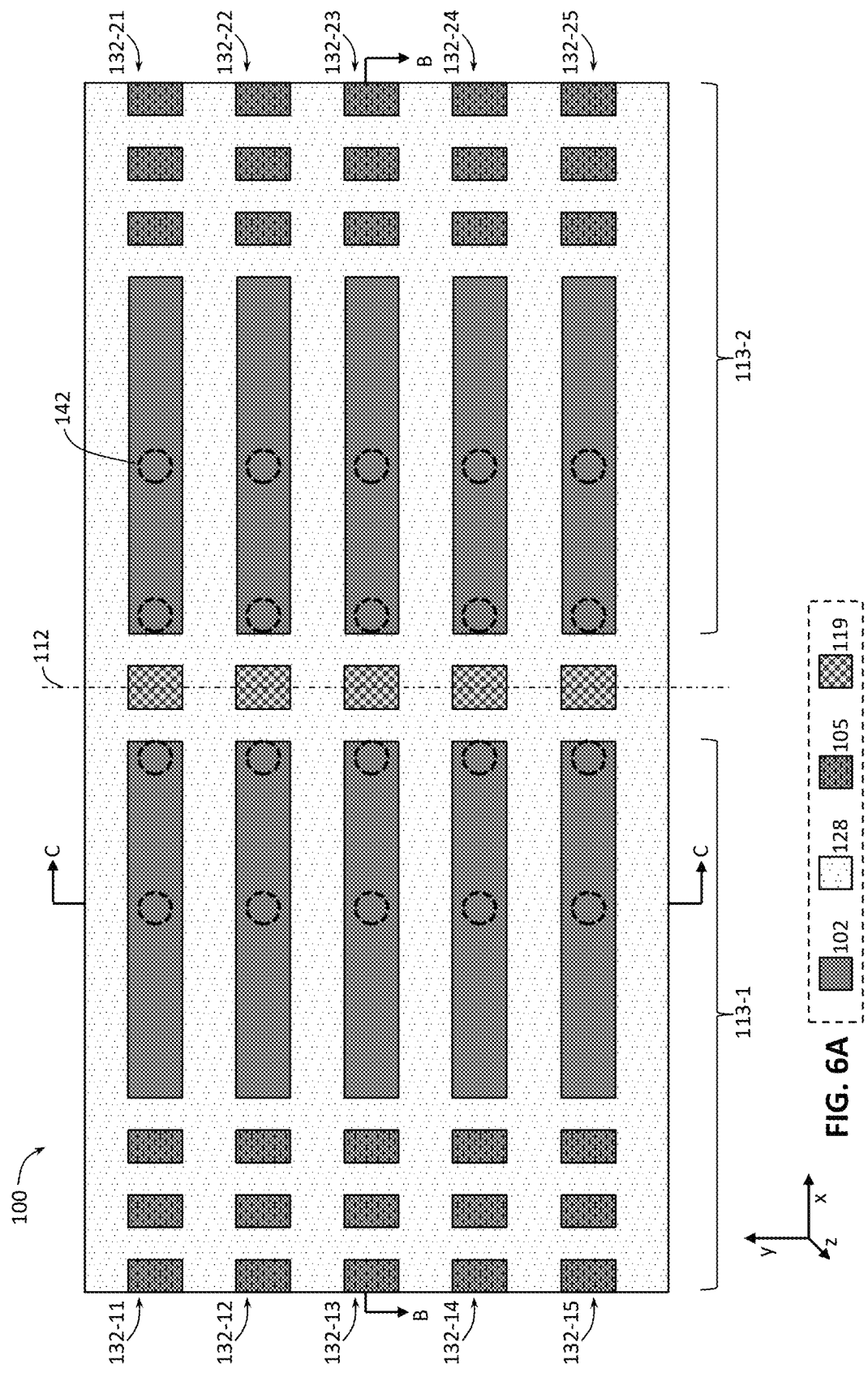
Figure 6C:
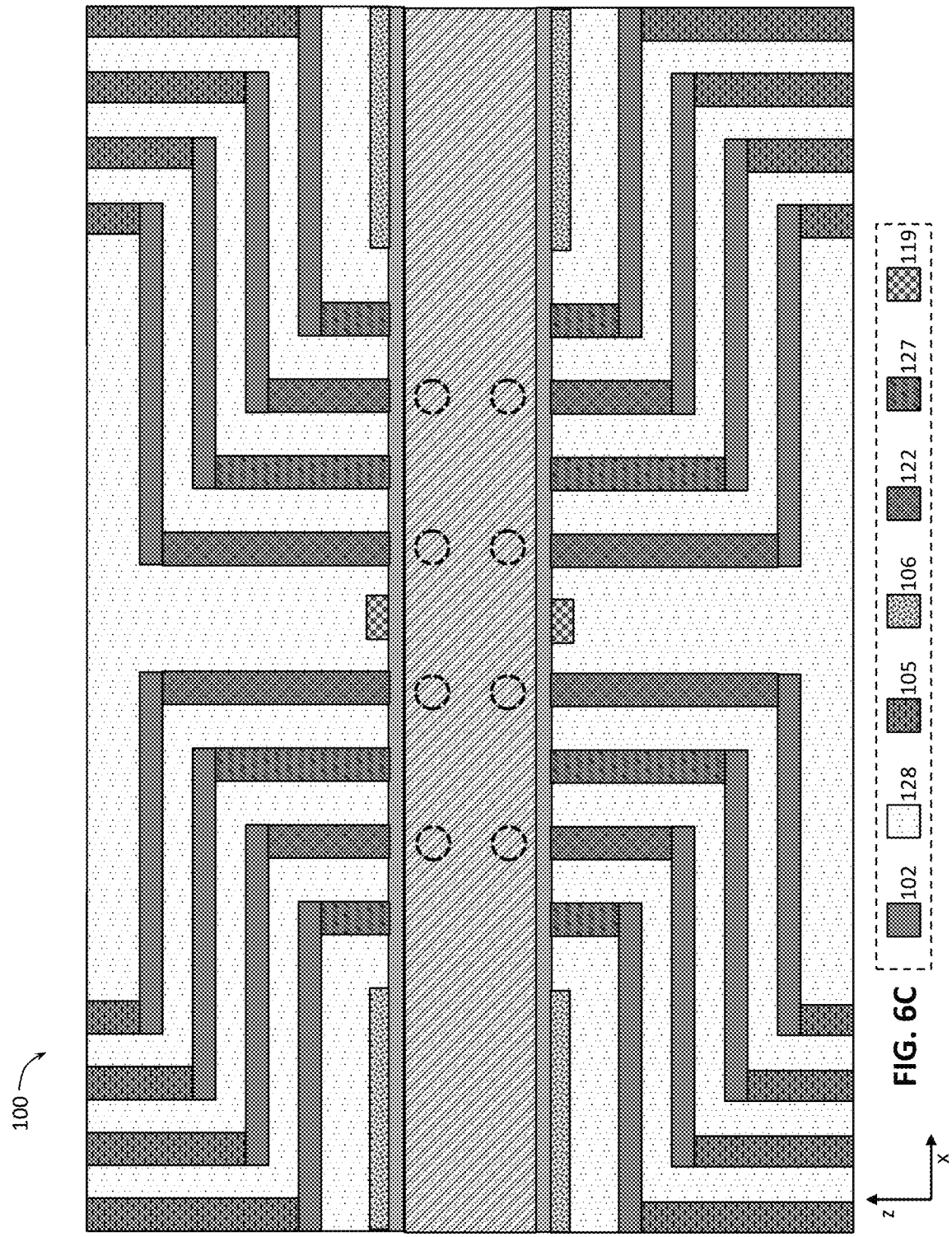

FIGS. 6A-6C are various views of a quantum dot device 100 with independent gate control, according to a sixth set of embodiments of the present disclosure. Similar to FIG. 1A, FIG. 6A is a top view of a portion of the quantum dot device 100 with some of the materials removed so that the first gate lines 102, the contact vias 105, and the accumulation gates 119 are visible; and FIG. 6B is a view through the section B-B of FIG. 6A (a cross-section across a plane similar to that shown in FIG. 1B). FIG. 6C is a cross-sectional side view similar to that of FIG. 6B, but illustrating a double-sided embodiment of the quantum dot device 100.

The quantum dot device 100 shown in FIG. 6 is similar to that of FIG. 5 and, therefore, all of the descriptions provided with reference to FIG. 5 are applicable to FIG. 6, except for the differences that will now be described. In particular, in the quantum dot device 100 shown in FIG. 6, the center gates 137 that were present in the quantum dot device 100 of FIG. 5 are replaced by the accumulation gates 119 to provide further control of the electrostatics associated with operating the qubits of the quantum dot device 100. The accumulation gates 119 may be implemented similar to the third gate lines 106, described above. In particular, portions of the quantum well stack 146 under the accumulation gates 119 may also include doped portions of semiconductor material, with doping concentrations higher than in areas of the quantum well stack 146 outside of the areas under the accumulation gates 119 and the third gate lines 119 (e.g., with doping concentrations higher than in areas of the quantum well stack 146 over which the gates 122, 127 are provided). For example, with reference to the regions labeled in FIG. 6B, in some embodiments, doping concentrations in portions 129-2 and 129-4 of the quantum well stack 146 where quantum dots may be formed (i.e., in quantum dot formation regions) may be lower than doping concentrations in portions 129-1, 129-3, and 129-5 of the quantum well stack 146 (the latter portions being doped regions under the accumulation gates), where the dopant concentration differences may be as described above with reference to the portions 101 shown in FIG. 1G.

Although the views of FIGS. 6A-6B illustrate various gate lines and gates provided on one side of the quantum well stack 146, double-sided implementations of the arrangement as shown in FIGS. 6A-6B are also possible, one example cross-section of which is shown in FIG. 6C.

Figure 7A:
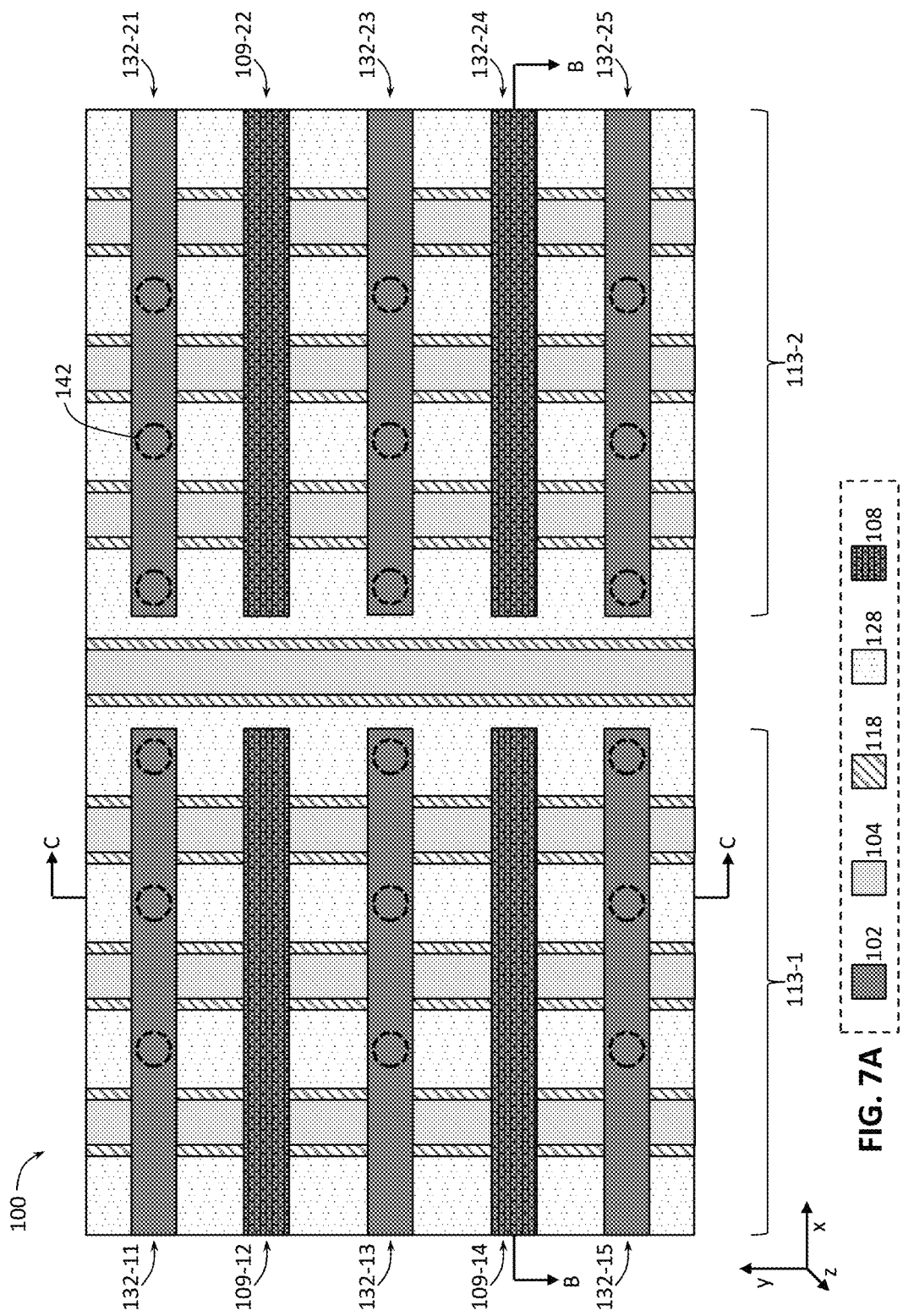

FIGS. 7A-7B are various views of a quantum dot device 100 with independent gate control, according to a seventh set of embodiments of the present disclosure. Similar to FIG. 3A, FIG. 7A is a top view of a portion of the quantum dot device 100 with some of the materials removed so that first gate lines 102 and second gate lines 104 are visible; and FIG. 7B is a view through the section B-B of FIG. 7A (a cross-section across the same plane as that shown in FIG. 1B). FIG. 7A further illustrates a section C-C; the view through the section C-C of FIG. 7A may look substantially the same as shown in FIG. 3C. Although the views of FIG. 7 illustrate various gate lines and gates provided on one side of the quantum well stack 146, double-sided implementations of the arrangement as shown in FIG. 7 are also possible and within the scope of the present disclosure, e.g., similar to the double-sided example cross-section shown in FIG. 1K.

The quantum dot device 100 shown in FIG. 7 is similar to that of FIG. 3 and, therefore, all of the descriptions provided with reference to FIG. 3 are applicable to FIG. 7, except for the differences that will now be described. In particular, in the embodiments of FIG. 7, the gate lines 108 extending in parallel rows 109 are discontinuous between the arrays 113. Thus, in some embodiments, for each of the arrays 113, the fourth gate lines 108 may extend in parallel rows 109 (i.e., different fourth gate lines 108 may be parallel to one another), where, in each of the arrays 113, an individual fourth gate line 108 may be provided between a pair of adjacent rows 132 of the first gate lines 102, and where the rows 109 may be parallel to the rows 132. For example, as shown in FIG. 7, in the first array 113-1, a first row 109-12 (replacing the row 132-12) may include a first instance of the fourth gate line 108, provided between a pair of adjacent rows 132-11 and 132-13, while a second row 109-14 (replacing the row 132-14) may include a second instance of the fourth gate line 108, provided between a pair of adjacent rows 132-13 and 132-15. As further shown in FIG. 7, similarly, in the second array 113-2, a first row 109-22 (replacing the row 132-22) may include a first instance of the fourth gate line 108, provided between a pair of adjacent rows 132-21 and 132-23, while a second row 109-24 (replacing the row 132-24) may include a second instance of the fourth gate line 108, provided between a pair of adjacent rows 132-23 and 132-25. Similar to how it was described with reference to FIG. 3, the fourth gate lines 108 of the quantum dot device 100 of FIG. 7 may be used as screening gates to improve electrostatics of the quantum dot device 100 and enable a more precise control of the quantum dot formation in the quantum well stack 146, where discontinuity of the fourth gate lines 108 between the first array 113-1 and the second array 113-2 may provide an additional level of fine-tuning of the electrostatics because discontinued gate lines may be controlled individually (i.e., may be coupled to different signal sources). In some implementations, gates formed by the fourth gate lines 108 of the quantum dot device 100 of FIG. 7 may provide means to control coupling between quantum dots from adjacent arrays 113, thus further improving control of the quantum dot electrostatics.

Figure 8:
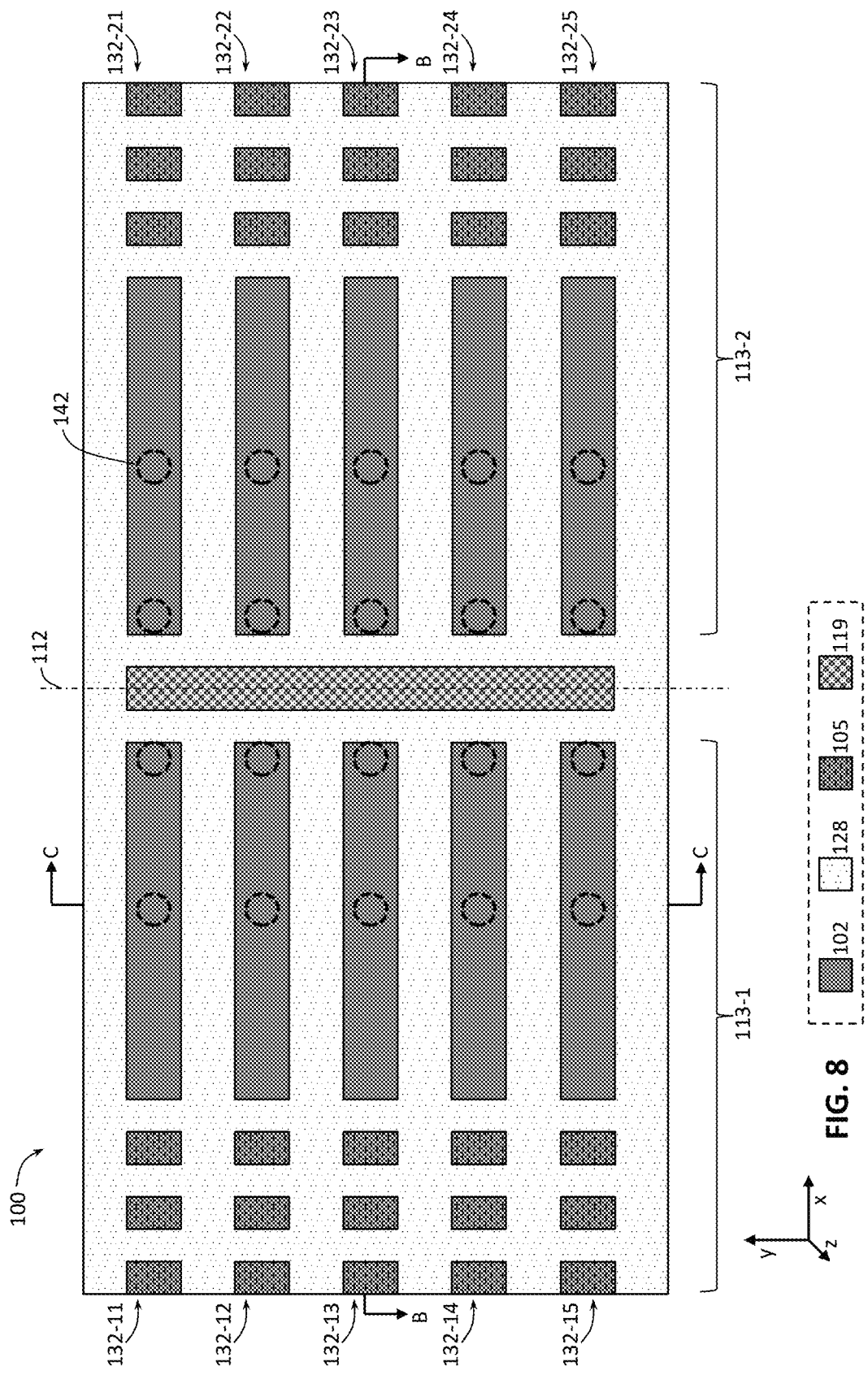
FIG. 8 is a top-down view of a quantum dot device with independent gate control, according to an eighth set of embodiments of the present disclosure.

FIG. 8 is a top-down view of a quantum dot device 100 with independent gate control, according to an eighth set of embodiments of the present disclosure. Similar to FIG. 6A, FIG. 8 is a top view of a portion of the quantum dot device 100 with some of the materials removed so that the first gate lines 102, the contact vias 105, and the accumulation gates 119 are visible. Other views of the quantum dot device 100 of FIG. 8 may look substantially the same as those of the quantum dot device 100 of FIG. 6.

The quantum dot device 100 shown in FIG. 8 is similar to that of FIG. 6 and, therefore, all of the descriptions provided with reference to FIG. 8 are applicable to FIG. 8, except for the differences that will now be described. FIGS. 6A and 8 show alternative implementations of the accumulation gates 119 between the first arrays 113-1 and the second array 113-2. In particular, FIG. 6A illustrates an embodiment where each pair of corresponding rows 132 of the first array 113-1 and the second array 113-2 may be associated with a respective accumulation gate 119, i.e., accumulation gates 119 of different rows provided along the direction of the y-axis have different accumulation gates 119 are electrically isolated from one another, thus enabling individual control of the gates 119 of different rows 132. On the other hand, FIG. 8 illustrates an accumulation gate 119 shared among multiple y-axis rows 132 of the quantum dot device 100.

FIGS. 9A-9H illustrate various examples of quantum well stacks 146 that may provide the quantum well stacks 146 of any of the embodiments of the quantum dot devices 100 with independent gate control disclosed herein.

In some embodiments, the layers of the quantum well stacks 146 may be grown on a substrate (e.g., a silicon or germanium wafer) (and on each other) by epitaxy. The quantum well stacks 146 illustrated in FIGS. 9A-9C include a single quantum well layer 152, and the quantum well stacks 146 illustrated in FIGS. 9D-9H include two quantum well layers 152 (e.g., as appropriate for a double-sided device). Generally, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIG. 7 to achieve such embodiments, as appropriate. Layers other than the quantum well layer(s) 152 in a quantum well stack 146 may have higher threshold voltages for conduction than the quantum well layer(s) 152 so that when the quantum well layer(s) 152 are biased at their threshold voltages, the quantum well layer(s) 152 conduct and the other layers of the quantum well stack 146 do not. This may avoid parallel conduction in both the quantum well layer(s) 152 and the other layers, and thus avoid compromising the strong mobility of the quantum well layer(s) 152 with conduction in layers having inferior mobility. In some embodiments, silicon used in a quantum well stack 146 may be isotopically enriched 28Si. In some embodiments, germanium used in a quantum well stack 146 may be isotopically enriched 70Ge, 72Ge, or 74Ge.

FIG. 9A is a cross-sectional view of a quantum well stack 146 including only a quantum well layer 152. The quantum well layer 152 may be formed of a material such that, during operation of the quantum dot device 100, a 2DEG may form in the quantum well layer 152 proximate to the upper surface of the quantum well layer 152. The gate dielectric 114 may be disposed on the upper surface of the quantum well layer 152. In some embodiments, the quantum well layer 152 of FIG. 9A may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 9A is formed of intrinsic silicon may be particularly advantageous for electron-type quantum dot devices 100. In some embodiments, the quantum well layer 152 of FIG. 9A may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 9A may take any suitable values. For example, in some embodiments, the thickness of the quantum well layer 152 (e.g., intrinsic silicon or germanium) may be between 0.8 microns and 1.2 microns.

FIG. 9B is a cross-sectional view of a quantum well stack 146 including a quantum well layer 152 and a barrier layer 154. The quantum well stack 146 may be disposed on a substrate such that the barrier layer 154 is disposed between the quantum well layer 152 and the substrate. The barrier layer 154 may provide a potential barrier between the quantum well layer 152 and the substrate. As discussed above with reference to FIG. 9A, the quantum well layer 152 of FIG. 9B may be formed of a material such that, during operation of the quantum dot device 100, a 2DEG may form in the quantum well layer 152 proximate to the upper surface of the quantum well layer 152. For example, in some embodiments in which the substrate is formed of silicon, the quantum well layer 152 of FIG. 9B may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thicknesses (i.e., z-heights) of the layers in the quantum well stack 146 of FIG. 9B may take any suitable values. For example, in some embodiments, the thickness of the barrier layer 154 (e.g., silicon germanium) may be between 0 nanometers and 400 nanometers. In some embodiments, the thickness of the quantum well layer 152 (e.g., silicon or germanium) may be between 5 nanometers and 30 nanometers.

FIG. 9C is a cross-sectional view of a quantum well stack 146 including a quantum well layer 152 and a barrier layer 154-1, as well as a buffer layer 176 and an additional barrier layer 154-2. The quantum well stack 146 may be disposed on a substrate such that the buffer layer 176 is disposed between the barrier layer 154-1 and the substrate. The buffer layer 176 may be formed of the same material as the barrier layer 154, and may be present to trap defects that form in this material as it is grown on the substrate. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 30%) at the barrier layer 154-1. The thicknesses (i.e., z-heights) of the layers in the quantum well stack 146 of FIG. 9C may take any suitable values. For example, in some embodiments, the thickness of the buffer layer 176 (e.g., silicon germanium) may be between 0.3 microns and 4 microns (e.g., 0.3-2 microns, or 0.5 microns). In some embodiments, the thickness of the barrier layer 154-1 (e.g., silicon germanium) may be between 0 nanometers and 400 nanometers. In some embodiments, the thickness of the quantum well layer 152 (e.g., silicon or germanium) may be between 5 nanometers and 30 nanometers (e.g., 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between 25 nanometers and 75 nanometers (e.g., 32 nanometers).

As discussed above with reference to FIG. 9B, the quantum well layer 152 of FIG. 9C may be formed of a material such that, during operation of the quantum dot device 100, a 2DEG may form in the quantum well layer 152 proximate to the upper surface of the quantum well layer 152. For example, in some embodiments in which the substrate is formed of silicon, the quantum well layer 152 of FIG. 9C may be formed of silicon, and the barrier layer 154-1 and the buffer layer 176 may be formed of silicon germanium. In some such embodiments, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1 but may be thicker than the barrier layer 154-1 so as to absorb the defects that arise during growth.

In some embodiments, the quantum well layer 152 of FIG. 9C may be formed of germanium, and the buffer layer 176 and the barrier layer 154-1 may be formed of silicon germanium. In some such embodiments, the silicon germanium of the buffer layer 176 may have a germanium content that varies from the substrate to the barrier layer 154-1; for example, the silicon germanium of the buffer layer 176 may have a germanium content that varies from zero percent at the substrate to a nonzero percent (e.g., 70%) at the barrier layer 154-1. The barrier layer 154-1 may in turn have a germanium content equal to the nonzero percent. In other embodiments, the buffer layer 176 may have a germanium content equal to the germanium content of the barrier layer 154-1 but may be thicker than the barrier layer 154-1 so as to absorb the defects that arise during growth. In some embodiments of the quantum well stack 146 of FIG. 9C, the buffer layer 176 and/or the barrier layer 154-2 may be omitted.

FIG. 9D is a cross-sectional view of a quantum well stack 146 including only a quantum well layer 152-1, a barrier layer 154, and a quantum well layer 152-2. In some embodiments, the quantum well layers 152 of FIG. 9D may be formed of intrinsic silicon, and the gate dielectrics 114 may be formed of silicon oxide; in such an arrangement, during use of the quantum dot device 100, a two-dimensional electron gas (2DEG) may form in the intrinsic silicon at the interface between the intrinsic silicon and the proximate silicon oxide. Embodiments in which the quantum well layers 152 of FIG. 9D are formed of intrinsic silicon may be particularly advantageous for electron-type quantum dot devices 100. In some embodiments, the quantum well layers 152 of FIG. 9D may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 9D may provide a potential barrier between the quantum well layer 152-1 and the quantum well layer 152-2. In some embodiments in which the quantum well layers 152 of FIG. 9D are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the quantum well stack 146 of FIG. 9D may take any suitable values. For example, in some embodiments, the thickness of the barrier layer 154 (e.g., silicon germanium) may be between 0 nanometers and 400 nanometers. In some embodiments, the thickness of the quantum well layers 152 (e.g., silicon or germanium) may be between 5 nanometers and 30 nanometers.

FIG. 9E is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. In the quantum dot device 100, the barrier layer 154-1 may be disposed between the quantum well layer 152-1 and the gate dielectric 114 at one face of the quantum well stack, and the barrier layer 154-3 may be disposed between the quantum well layer 152-2 and the gate dielectric 114 at the other face of the quantum well stack (e.g., for a double-sided quantum dot device 100). In some embodiments, the barrier layer 154-3 may be formed of a material (e.g., silicon germanium), and when the quantum well stack 146 is being grown on a substrate, the barrier layer 154-3 may include a buffer region of that material. This buffer region may trap defects that form in this material as it is grown on the substrate, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. In some embodiments, the buffer region may be lattice mismatched with the quantum well layer(s) 152 in a quantum well stack 146, imparting biaxial strain to the quantum well layer(s) 152.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. In some embodiments, the barrier layer 154-1 may have a similar form as the barrier layer 154-3, but may not include a "buffer region" as discussed above; in the quantum dot device 100, the barrier layer 154-3 and the barrier layer 154-1 may have substantially the same structure. The barrier layer 154-2 may take the form of any of the embodiments of the barrier layer 154 discussed above with reference to FIG. 9D. The thicknesses (i.e., z-heights) of the layers in the quantum well stack 146 of FIG. 9E may take any suitable values. For example, in some embodiments, the thickness of the barrier layers 154-1 and 154-3 (e.g., silicon germanium) in the quantum dot device 100 may be between 0 nanometers and 400 nanometers. In some embodiments, the thickness of the quantum well layers 152 (e.g., silicon or germanium) may be between 5 nanometers and 30 nanometers (e.g., 10 nanometers). In some embodiments, the thickness of the barrier layer 154-2 (e.g., silicon germanium) may be between 25 nanometers and 75 nanometers (e.g., 32 nanometers).

FIGS. 9F-9G illustrate examples of quantum well stacks 146 including doped layer(s) 137. As noted above, doped layer(s) 137 may be included in a quantum well stack 146 instead of or in addition to an accumulation region.

FIG. 9F is a cross-sectional view of a quantum well stack 146 including a buffer layer 176, a barrier layer 155-2, a quantum well layer 152-2, a barrier layer 154-2, a doped layer 137, a barrier layer 154-1, a quantum well layer 152-1, and a barrier layer 155-1.

The buffer layer 176 may be formed of the same material as the barrier layer 155-2, and may be present to trap defects that form in this material as it is grown. In some embodiments, the buffer layer 176 may be grown under different conditions (e.g., deposition temperature or growth rate) from the barrier layer 155-2. In particular, the barrier layer 155-2 may be grown under conditions that achieve fewer defects than the buffer layer 176. In some embodiments in which the buffer layer 176 includes silicon germanium, the silicon germanium of the buffer layer 176 may have a germanium content that varies to the barrier layer 155-2; for example, the silicon germanium of the buffer layer 176 may have a germanium content that varies from zero percent to a nonzero percent (e.g., 30%) at the barrier layer 155-2. The buffer layer 176 may be grown beyond its critical layer thickness such that it is substantially free of stress from the underlying base (and thus may be referred to as "relaxed"). In some embodiments, the thickness of the buffer layer 176 (e.g., silicon germanium) may be between 0.3 microns and 4 microns (e.g., between 0.3 microns and 2 microns, or 0.5 microns). In some embodiments, the buffer layer 176 may be lattice mismatched with the quantum well layer(s) 152 in a quantum well stack 146, imparting biaxial strain to the quantum well layer(s) 152.

The barrier layer 155-2 may provide a potential energy barrier proximate to the quantum well layer 152-2. The barrier layer 155-2 may be formed of any suitable materials. For example, in some embodiments in which the quantum well layer 152 is formed of silicon or germanium, the barrier layer 155-2 may be formed of silicon germanium. In some embodiments, the thickness of the barrier layer 155-2 may be between 0 nanometers and 400 nanometers (e.g., between 25 nanometers and 75 nanometers).

The quantum well layer 152-2 may be formed of a different material than the barrier layer 155-2. Generally, a quantum well layer 152 may be formed of a material such that, during operation of the quantum dot device 100, a 2DEG may form in the quantum well layer 152. Embodiments in which the quantum well layer 152 is formed of intrinsic silicon may be particularly advantageous for electron-type quantum dot devices 100. Embodiments in which a quantum well layer 152 is formed of intrinsic germanium may be particularly advantageous for hole-type quantum dot devices 100. In some embodiments, a quantum well layer 152 may be strained, while in other embodiments, a quantum well layer 152 may not be strained. The thickness of a quantum well layer 152 may take any suitable values; in some embodiments, a quantum well layer 152 may have a thickness between 5 nanometers and 30 nanometers.

In the quantum well stack 146 of FIG. 9F, the doped layer 137 may be "shared" by the two quantum well layers 152 in the quantum well stack 146, in that the doped layer 137 provides carriers to the quantum well layer 152-1 and the quantum well layer 152-2 during use. In the quantum dot device 100, the quantum well layer 152-1 may be disposed between the doped layer 137 and the gate dielectric 114-1, while the quantum well layer 152-2 may be disposed between the doped layer 137 and the gate dielectric 114-2. The doped layer 137 of FIG. 9F may be doped with an n-type material (e.g., for an electron-type quantum dot device 100) or a p-type material (e.g., for a hole-type quantum dot device 100). In some embodiments, the doping concentration of the doped layer 137 may be between $10^{17}/cm^3$ and $10^{20}/cm^3$ (e.g., between $10^{17}/cm^3$ and $10^{18}/cm^3$). The thickness (i.e., z-height) of the doped layer 137 may depend on the doping concentration, among other factors, and in some embodiments, may be between 5 nanometers and 50 nanometers (e.g., between 20 nanometers and 30 nanometers).

A doped layer 137 may be formed using any of a number of techniques. In some embodiments, a doped layer 137 may be formed of an undoped base material (e.g., silicon germanium) that is doped in situ during growth of the base material by epitaxy. In some embodiments, a doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, a doped layer 137 may initially be fully formed of an undoped base material (e.g., silicon germanium), and the dopant may be implanted into the lattice (and, in some embodiments, may be subsequently annealed). In some embodiments, a doped layer 137 may be provided by a silicon germanium layer (e.g., with 90% germanium content) doped with an n-type dopant. In general, any suitable technique may be used to form a doped layer 137.

The barrier layer 154-2 may not be doped, and thus may provide a barrier to prevent impurities in the doped layer 137 from diffusing into the quantum well layer 152-2 and forming recombination sites or other defects that may reduce channel conduction and thereby impede performance of the quantum dot device 100. In some embodiments of the quantum well stack 146 of FIG. 9F, the doped layer 137 may include a same material as the barrier layer 154-2, but the barrier layer 154-2 may not be doped. For example, in some embodiments, the doped layer 137 and the barrier layer 154-2 may both be silicon germanium. In some embodiments in which the quantum well layer 152-2 is formed of silicon, the barrier layer 154-2 may be formed of silicon germanium. The germanium content of this silicon germanium may be 20-80% (e.g., 30%). In some embodiments in which the quantum well layer 152-2 is formed of germanium, the barrier layer 154-2 may be formed of silicon germanium (with a germanium content of 20-80% (e.g., 70%)). The thickness of the barrier layer 154-2 may depend on the doping concentration of the doped layer 137, among other factors discussed below, and in some embodiments, may be between 5 nanometers and 50 nanometers (e.g., between 20 nanometers and 30 nanometers).

The barrier layer 154-1 may provide a barrier to prevent impurities in the doped layer 137 from diffusing into the quantum well layer 152-1, and may take any of the forms described herein for the barrier layer 154-2. Similarly, the quantum well layer 152-1 may take any of the forms described herein for the quantum well layer 152-2. The barrier layer 155-1 may provide a potential energy barrier proximate to the quantum well layer 152-1 (as discussed above with reference to the barrier layer 155-2 and the quantum well layer 152-2), and may take any of the forms described herein for the barrier layer 155-2.

The thickness of a barrier layer 154 may impact the ease with which carriers in the doped layer 137 can move into a quantum well layer 152 disposed on the other side of the barrier layer 154. The thicker the barrier layer 154, the more difficult it may be for carriers to move into the quantum well layer 152; at the same time, the thicker the barrier layer 154, the more effective it may be at preventing impurities from the doped layer 137 from moving into the quantum well layer 152. Additionally, the diffusion of impurities may depend on the temperature at which the quantum dot device 100 operates. Thus, the thickness of the barrier layer 154 may be adjusted to achieve a desired energy barrier and impurity screening effect between the doped layer 137 and the quantum well layer 152 during expected operating conditions.

In some embodiments of the quantum well stack 146 of FIG. 9F (e.g., those included in "single-sided" quantum dot devices 100), only a single quantum well layer 152 may be included. For example, the layers 154-1 and 152-1 may be omitted, and gates may be formed proximate to the barrier layer 155-1 such that the quantum well layer 152-1 is disposed between the gates and the doped layer 137. In other embodiments, the layers 154-1, 152-1, and 155-2 may be omitted, and gates may be formed proximate to the doped layer 137. In some embodiments, the buffer layer 176 and/or the barrier layer 155-2 may be omitted from the quantum well stack 146 of FIG. 9F.

FIG. 9G is a cross-sectional view of a quantum well stack 146 that is similar to the quantum well stack 146 of FIG. 9F, except that in the place of the single doped layer 137 shared by two quantum well layers 152, the quantum well stack 146 of FIG. 9G includes two different doped layers 137-2 and 137-1 (spaced apart by a barrier layer 155-3). In such an embodiment, the doped layer 137-2 may provide a source of carriers for the quantum well layer 152-2, and the doped layer 137-1 may provide a source of carriers for the quantum well layer 152-1. The barrier layer 155-3 may provide a potential barrier between the two doped layers 137, and may take any suitable form. Generally, the elements of the quantum well stack 146 of FIG. 9G may take the form of any of the corresponding elements of the quantum well stack 146 of FIG. 9F. The doped layers 137-1 and 137-2 may have the same geometry and material composition, or may have different geometries and/or material compositions.

FIG. 9H is a cross-sectional view of a quantum well stack 146 in which two doped layers 137-1 and 137-2 are disposed toward the "outside" of the quantum well stack 146, rather than the "inside" of the quantum well stack 146, as illustrated in FIGS. 9F and 10G. In particular, the quantum well layer 152-2 is disposed between the doped layer 137-2 and the quantum well layer 152-1, and the quantum well layer 152-1 is disposed between the doped layer 137-1 and the quantum well layer 152-2. In the quantum dot device 100, the doped layer 137-1 may be disposed between the quantum well layer 152-1 and the gate dielectric 114-1, while the doped layer 137-2 may be disposed between the quantum well layer 152-2 and the gate dielectric 114-2. In the quantum well stack 146 of FIG. 9H, a barrier layer 155-3 provides a potential barrier between the quantum well layers 152-1 and 152-2 (rather than between the doped layers 137-1 and 137-2, as illustrated in the quantum well stack 146 of FIG. 9G). Generally, the elements of the quantum well stack 146 of FIG. 9H may take the form of any of the corresponding elements of the quantum well stack 146 of FIGS. 9D-9G.

In some particular embodiments in which the quantum dot device 100 is a "single-sided" device with only one set of gates, the quantum well stack 146 may include a silicon base, a buffer layer 176 of silicon germanium (e.g., with 30% germanium content), then a doped layer 137 formed of silicon germanium doped with an n-type dopant, a thin barrier layer 154 formed of silicon germanium (e.g., silicon germanium with 70% germanium content), a silicon quantum well layer 152, and a barrier layer 155 formed of silicon germanium (e.g., with 30% germanium content); in such an embodiment, the gates may be disposed on the barrier layer 155. In some other particular embodiments in which the quantum dot device 100 is a "single-sided" device with only one set of gates, the quantum well stack 146 may include a silicon base, a doped layer 137 formed of silicon doped with an n-type dopant, a thin barrier layer 154 formed of silicon germanium, and a silicon quantum well layer 152; in such an embodiment, the gates may be disposed on the silicon quantum well layer 152.

As noted above, any of the quantum dot devices 100 disclosed herein may include magnet lines that, during operation of the quantum dot device 100, may generate magnetic fields to selectively "address" different quantum dots. More generally, the magnet lines may be used to generate magnetic fields to create an energy difference in the quantum states of a quantum dot (e.g., in the two spin states of an electron spin-based quantum dot). The quantum states of a quantum dot may also be manipulated by application of RF energy, creating a quantum bit capable of computation.

The magnetic field experienced by different ones of the quantum dots may be a function of the distance and angle of that quantum dot from the different ones of the magnet lines, as known in the art. As noted above, different ones of the quantum dots may be driven (e.g., their spin states manipulated) by matching the resonance of the magnetic field with the resonance of the quantum dot. For example, the quantum dot device 100 may implement electron spin resonance (ESR) and/or electron dipole spin resonance (EDSR) techniques for quantum state manipulation.

In some embodiments, the magnet lines may be formed of a magnetic material, such as a ferromagnetic material, cobalt, iron, or nickel. In such embodiments, the magnet lines may generate a magnetic field even in the absence of an applied current (although a current may also be applied to tune the magnetic field of magnetic magnet lines). EDSR techniques may be implemented in such embodiments to drive transitions between different quantum states in quantum dots. In some embodiments, the magnet lines may be formed of a conductive (but not necessarily magnetic) material, such as a superconducting material (e.g., aluminum, titanium nitride, niobium titanium, or niobium titanium nitride). DC and/or AC currents may be passed through such non-magnetic magnet lines to generate magnetic field gradients as desired. ESR techniques may be implemented in such embodiments to drive transitions between different quantum states in quantum dots. IN some embodiments, magnet lines may be arranged in a parallel array above or below the gates in any of the embodiments disclosed herein.

In some embodiments, the first gate lines 102, second gate lines 104, and/or third gate lines 106 may themselves act as magnet lines; in some such embodiments, additional magnet lines (such as any of those discussed above) may or may not be included in a quantum dot device 100. Such gate lines may serve two purposes: to provide a localized electrostatic potential that helps to confine or otherwise affect a quantum dot, and to provide a magnetic field gradient that allows a quantum dot to be driven between different quantum states (e.g., spin states). As discussed above, ESR techniques may be implemented when a gate line includes a superconducting material to drive transitions between different quantum states in quantum dots.

In some embodiments in which a gate line (e.g., a first gate line 102 and/or a second gate line 104) acts as a magnet line, the metal of that gate line may be a superconductor, such as aluminum, titanium nitride (e.g., deposited via atomic layer deposition), or niobium titanium nitride. In such embodiments, application of an appropriate AC or DC current (e.g., by a control circuitry) to the gate line may cause a desired magnetic field to be generated. In some embodiments in which a gate line acts as a magnet line, the metal of that gate line may be a magnetic material, such as a ferromagnetic material, cobalt, iron, or nickel. In such embodiments, the gate line may generate a magnetic field even in the absence of an applied current (although a current may also be applied to tune the magnetic field of magnetic gate lines). As discussed above, EDSR techniques may be implemented when a gate line includes a magnetic material to drive transitions between different quantum states in quantum dots.

The quantum dot devices 100 illustrated in various ones of the figures have particular regular patterns of gates. In some embodiments of the quantum dot devices 100 disclosed herein, the pattern of gates may be sparser than illustrated in the figures, with certain ones of the gates omitted to create a sparser arrangement with any desired pattern.

Other embodiments of the quantum dot device 100 with different arrangements of gate lines to enable independent gate control in accordance with considerations described herein are possible and are within the scope of the present disclosure. The exact arrangement of various gate lines described herein may be selected for a particular design of a quantum dot device 100 based on considerations such as fabrication processes required to fabricate the device, the desired isolation between various gates, the desired control of the electrostatics in the device, complexity of routing signals to various gates, the desired accuracy of reading the states of different active quantum dots 142, etc.

Quantum dot devices with independent gate control as described above may be implemented using any kind of qubit devices or be included in any kind of quantum processing devices/structures. Some examples of such devices/structures are illustrated in FIGS. 10A-10B, FIG. 11, and FIG. 12.

Figure 10B:
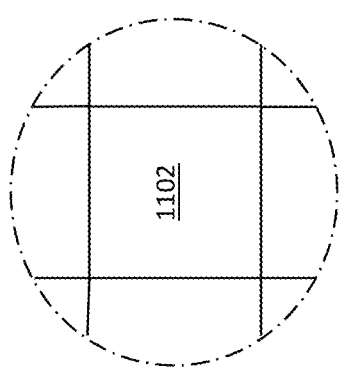
FIGS. 10A and 10B are top-down views of a wafer and a die that may include any of the quantum dot devices disclosed herein.
Figure 10A:
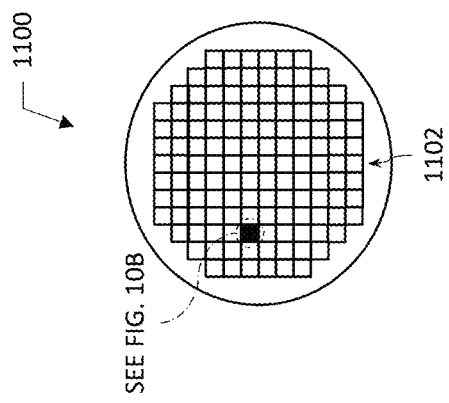

FIGS. 10A-10B are top views of a wafer 1100 and dies 1102 that may be formed from the wafer 1100, according to some embodiments of the present disclosure. Dies 1102 may include any of the quantum dot devices with independent gate control disclosed herein, e.g., any embodiments of the quantum dot devices 100 with independent gate control, any further embodiments of such quantum dot devices as described herein, or any combinations of such quantum dot devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 12) or other logic that is configured to store information in the memory devices or execute instructions stored in the memory array.

Figure 11:
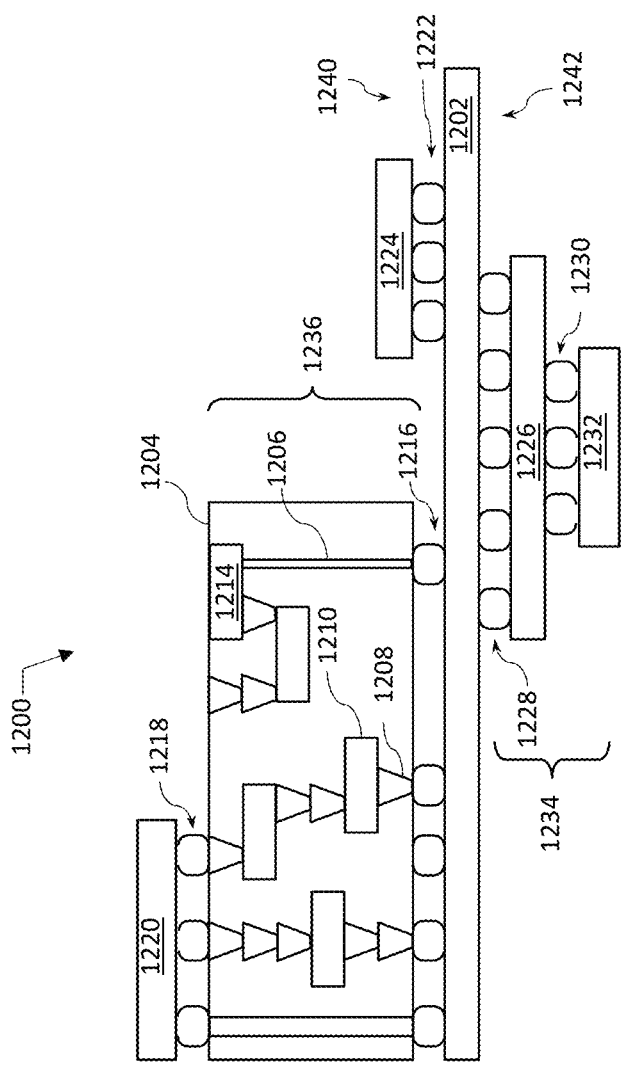
FIG. 11 is a cross-sectional side view of a device assembly that may include any of the quantum dot devices disclosed herein.

FIG. 11 is a cross-sectional side view of a device assembly 1200 that may include any of the embodiments of the quantum dot devices with independent gate control as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 11 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 11), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 11, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum dot devices with independent gate control as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 11, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum dot devices with independent gate control disclosed herein; or may be a conventional IC package, for example.

The device assembly 1200 illustrated in FIG. 11 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 12:
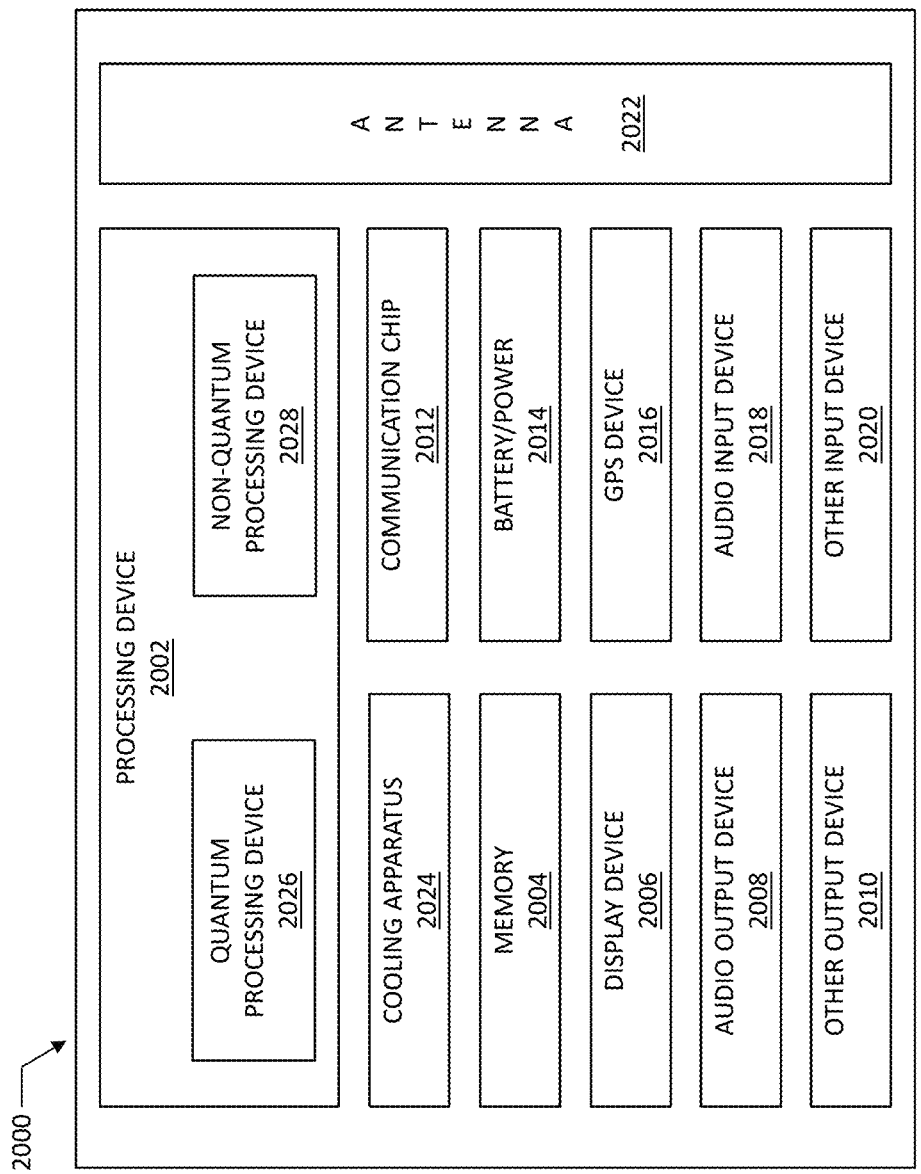
FIG. 12 is a block diagram of an example quantum computing device that may include any of the quantum dot devices disclosed herein, in accordance with various embodiments.

FIG. 12 is a block diagram of an example quantum computing device 2000 that may include any of the quantum dot devices with independent gate control as disclosed herein, or any combinations of such quantum dot devices. Several components are illustrated in FIG. 12 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum dot devices with independent gate control as described herein. In some embodiments, various ones of these components may be fabricated onto a single system-on-a-chip (SoC) die. Additionally, in various embodiments, the quantum computing device 2000 may not include one or more of the components illustrated in FIG. 12, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum dot devices with independent gate control as disclosed herein, and may perform data processing by performing operations on the qubits that may be generated in the quantum dot devices 100, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 provides a quantum dot device that includes a quantum well stack; N parallel rows of first gate lines (e.g., gate lines 102 of the present drawings), provided over the quantum well stack at a distance from one another (e.g., arranged in a regular pattern with equal spacing between adjacent rows, with an insulator material electrically isolating different rows from one another), where an individual row of the N parallel rows of the first gate lines includes M parallel first gate lines stacked above one another at a distance from one another (e.g., arranged in a regular pattern with equal spacing between adjacent gate lines stacked above one another, with an insulator material electrically isolating different first gate lines within a given row from one another), where each of N and M is an integer greater than 1; and a gate that extends toward the quantum well stack from each of the first gate lines, where, for an individual row of the N parallel rows of the first gate lines, the gates that extend toward the quantum well stack from the M parallel first gate lines (e.g., M such gates) are electrically isolated from one another and are arranged above a respective row of a quantum dot formation region in the quantum well stack (i.e., different rows of the N parallel rows of the first gate lines have gates that are arranged above different rows of N rows of quantum formation regions).

Example 2 provides the quantum dot device according to example 1, where adjacent rows of the N parallel rows of first gate lines are substantially equidistant.

Example 3 provides the quantum dot device according to any one of the preceding examples, further including an insulator material between the first gate lines (i.e., the first gate lines are electrically isolated from one another).

Example 4 provides the quantum dot device according to any one of the preceding examples, further including parallel rows of second gate lines (e.g., gate lines 104 of the present drawings), where the second gate lines are oriented perpendicular to the first gate lines (and both first and second gate lines oriented parallel to the quantum well stack).

Example 5 provides the quantum dot device according to example 4, where the second gate lines are closer to the quantum well stack than the first gate lines.

Example 6 provides the quantum dot device according to examples 4 or 5, further including a hardmask between portions of the second gate lines and portions of the first gate lines that are above the portions of the second gate lines (i.e., the second gate lines are electrically isolated from the first gate lines).

Example 7 provides the quantum dot device according to any one of examples 4-6, further including a spacer material between portions of the second gate lines and adjacent portions of the gates (i.e., the second gate lines are electrically isolated from the gates).

Example 8 provides the quantum dot device according to any one of examples 4-7, where at least a subset of the second gate lines is arranged so that, for an individual row of the N parallel rows of the first gate lines, a respective second gate line is between each pair of adjacent gates of the row.

Example 9 provides the quantum dot device according to example 8, where individual ones of the second gate lines extend across multiple ones of the N parallel rows of the first gate lines.

Example 10 provides the quantum dot device according to any one of the preceding examples, further including parallel rows of third gate lines (e.g., gate lines 106 of the present drawings), where the third gate lines are oriented perpendicular to the second gate lines and parallel to the quantum well stack.

Example 11 provides the quantum dot device according to example 10, where each of the third gate lines is between the quantum well stack and a different one of the N parallel rows of first gate lines.

Example 12 provides the quantum dot device according to example 11, where, for the each of the third gate lines, the M parallel first gate lines of the different one of the N parallel rows of first gate lines are stacked above the third gate line.

Example 13 provides the quantum dot device according to any one of examples 10-12, where the third gate lines are closer to the quantum well stack than the first gate lines.

Example 14 provides the quantum dot device according to any one of examples 10-13, further including a hardmask between portions of the third gate lines and portions of the first gate lines that are above the portions of the third gate lines (i.e., the third gate lines are electrically isolated from the first gate lines).

Example 15 provides the quantum dot device according to any one of the preceding examples, further including contact vias extending toward (and contacting) respective ones of the first gate lines in a one-to-one correspondence (i.e., a different contact via extends towards each of the first gate lines), where, for an individual row of the N parallel rows of the first gate lines, contact vias to the M parallel first gate lines stacked above one another are arranged in a staircase manner.

Example 16 provides the quantum dot device according to any one of the preceding examples, further including a gate dielectric between the gate and the quantum well stack.

Example 17 provides the quantum dot device according to any one of the preceding examples, where the quantum well stack includes a layer of silicon or a layer of germanium, and a layer of gate dielectric is on the layer of silicon or the layer of germanium.

Example 18 provides the quantum dot device according to any one of the preceding examples, where any one of the first gate lines, the second gate lines, and the third gate lines include one or more superconducting materials.

Example 19 provides the quantum dot device according to any one of the preceding examples, where any one of the first gate lines, the second gate lines, and the third gate lines include a magnetic material.

Example 20 provides the quantum dot device according to any one of the preceding examples, where the quantum well stack has a first face and a second opposing face, and the first gate lines, the second gate lines, and the third gate lines are at the first face of the quantum well stack.

Example 21 provides a quantum dot device that includes a quantum well stack; a plurality of parallel gate lines stacked above one another at a distance from one another (e.g., arranged in a regular pattern with equal spacing between adjacent gate lines stacked above one another, with an insulator material electrically isolating different first gate lines within a given row from one another) over the quantum well stack; and a gate that extends toward the quantum well stack from each of the plurality of parallel gate lines, where the gates from the plurality of parallel gate lines are arranged along a row of a quantum dot formation region in the quantum well stack.

Example 22 provides the quantum dot device according to example 21, further including a first accumulation gate provided over a first doped region in the quantum well stack; and a second accumulation gate provided over a second doped region in the quantum well stack, where the first doped region is adjacent to a first end of the row of the quantum dot formation region, the second doped region is adjacent to a second end of the row of the quantum dot formation region, the second end being opposite the first end, and a dopant concentration in the row of the quantum dot formation region is lower than a dopant concentration in the first doped region and a dopant concentration in the second doped region.

Example 23 provides the quantum dot device according to examples 21 or 22, further including components of the quantum dot device according to any one of examples 1-20.

Example 24 provides a quantum dot device that includes a quantum well stack; and a first set and a second set of gate lines. An individual one of the first set (e.g., gate lines of a row 132-11, described herein) and the second set (e.g., gate lines of a row 132-13, described herein) may include a first gate line (e.g., a bottom gate line 102 of a given row 132, described herein); a second gate line (e.g., a top gate line 102 of a given row 132, described herein) parallel to the first gate line, where the first gate line is between the quantum well stack and the second gate line (i.e., the first and second gate lines are stacked above the quantum well stack, with the first gate line being closer to the quantum well stack than the second gate line); an insulator material (e.g., insulator material 128, described herein) between the quantum well stack and the first gate line, and between the first gate line and the second gate line; a first conductive via extending from the first gate line, through the insulator material, toward the quantum well stack; and a second conductive via extending from the second gate line, through the insulator material, toward the quantum well stack, where the insulator material is further between the first conductive via and the second conductive via (i.e., the vias may be electrically isolated from one another). In such a quantum dot device, a projection of the first set of gate lines onto the quantum well stack may be substantially parallel to a projection of the second set of gate lines onto the quantum well stack.

Example 25 provides the quantum dot device according to example 24, where projections of the first conductive via and the second conductive via of the first set are arranged along a first row of quantum dot formation region in the quantum well stack, and where projections of the first conductive via and the second conductive via of the second set are arranged along a second row of quantum dot formation region in the quantum well stack.

Example 26 provides the quantum dot device according to example 25, wherein the first row of quantum dot formation region in the quantum well stack is parallel to, and at a distance from, the second row of quantum dot formation region in the quantum well stack.

Example 27 provides the quantum dot device according to any one of examples 24-26, further including a third gate line (e.g., a gate line 108, described herein), where a projection of the third gate line onto the quantum well stack is parallel to the projection of the first set of gate lines onto the quantum well stack, and a distance between the third gate line and the quantum well stack is smaller than a distance between the first gate line of the first set of gate lines and the quantum well stack (i.e., the third gate line is closer to the quantum well stack than the first gate line of the first set of gate lines).

Example 28 provides the quantum dot device according to example 27, further including a fourth gate line (e.g., a gate line 104, described herein), where a projection of the fourth gate line onto the quantum well stack is perpendicular to the projection of the first set of gate lines onto the quantum well stack, a distance between the fourth gate line and the quantum well stack is smaller than a distance between the first gate line of the first set of gate lines and the quantum well stack (i.e., the fourth gate line is closer to the quantum well stack than the first gate line of the first set of gate lines), and the third gate line overlaps the fourth gate line, with one or more spacer materials electrically isolating the third gate line from the fourth gate line.

Example 29 provides the quantum dot device according to any one of examples 24-28, further including components of the quantum dot device according to any one of examples 1-23.

Example 30 provides a quantum dot device that includes a quantum well stack having a first face and an opposing second face; a plurality of first gate lines (e.g., gate lines 102 on one side of a double-sided quantum dot device) stacked above one another at a distance from one another (e.g., arranged in a regular pattern with equal spacing between adjacent gate lines stacked above one another, with an insulator material electrically isolating different first gate lines within a given row from one another) over the first face of the quantum well stack; a gate that extends toward the first face of the quantum well stack from each of the first gate lines; a plurality of second gate lines (e.g., gate lines 102 on the other side of a double-sided quantum dot device) stacked above one another at a distance from one another (e.g., arranged in a regular pattern with equal spacing between adjacent gate lines stacked above one another, with an insulator material electrically isolating different second gate lines within a given row from one another) over the second face of the quantum well stack; and a gate that extends toward the second face of the quantum well stack from each of the second gate lines.

Example 31 provides the quantum dot device according to example 30, where the gates from the first gate lines are arranged along a first row of a quantum dot formation region in the quantum well stack.

Example 32 provides the quantum dot device according to examples 30 or 31, where the gates from the second gate lines are arranged along a second row of a quantum dot formation region in the quantum well stack.

Example 33 provides the quantum dot device according to any one of examples 30-32, further including an insulator material between the first gate lines (i.e., the first gate lines are electrically isolated from one another).

Example 34 provides the quantum dot device according to any one of examples 30-33, further including an insulator material between the second gate lines (i.e., the second gate lines are electrically isolated from one another).

Example 35 provides the quantum dot device according to any one of examples 30-34, further including a third gate line (e.g., a gate line 104 on one side of a double-sided quantum dot device) over the first face of the quantum well stack, where the third gate line is oriented perpendicular to the first gate lines.

Example 36 provides the quantum dot device according to example 35, where the third gate line is closer to the first face of the quantum well stack than the first gate lines.

Example 37 provides the quantum dot device according to examples 35 or 36, where the first gate lines and the third gate line are oriented parallel to the quantum well stack and closer to the first face of the quantum well stack than to the second face of the quantum well stack.

Example 38 provides the quantum dot device according to any one of examples 35-37, further including a hardmask between the third gate line and portions of the first gate lines that are above the third gate line.

Example 39 provides the quantum dot device according to any one of examples 35-38, where the third gate line is electrically isolated from the first gate lines.

Example 40 provides the quantum dot device according to any one of examples 35-39, further including a spacer material between the third gate line and adjacent portions of the gates that extend toward the first face of the quantum well stack from the first gate lines.

Example 41 provides the quantum dot device according to any one of examples 35-40, where the third gate line is electrically isolated from the gates over the first face of the quantum well stack.

Example 42 provides the quantum dot device according to any one of examples 30-41, further including a fourth gate line (e.g., a gate line 104 on the other side of a double-sided quantum dot device) over the second face of the quantum well stack, where the fourth gate line is oriented perpendicular to the second gate lines.

Example 43 provides the quantum dot device according to example 42, where the fourth gate line is closer to the second face of the quantum well stack than the second gate lines.

Example 44 provides the quantum dot device according to examples 42 or 43, where the second gate lines and the fourth gate line are oriented parallel to the quantum well stack and closer to the second face of the quantum well stack than to the first face of the quantum well stack.

Example 45 provides the quantum dot device according to any one of examples 42-44, further including a hardmask between the fourth gate line and portions of the second gate lines that are above the fourth gate line.

Example 46 provides the quantum dot device according to any one of examples 42-45, where the fourth gate line is electrically isolated from the second gate lines.

Example 47 provides the quantum dot device according to any one of examples 42-46, further including a spacer material between the fourth gate line and adjacent portions of the gates that extend toward the second face of the quantum well stack from the second gate lines.

Example 48 provides the quantum dot device according to any one of examples 42-47, where the fourth gate line is electrically isolated from the gates over the second face of the quantum well stack.

Example 49 provides the quantum dot device according to any one of examples 30-48, further including components of the quantum dot device according to any one of examples 1-29.

Example 50 provides a quantum computing device that includes a quantum processing device, where the quantum processing device includes a quantum dot device according to any one of the preceding examples, e.g., it includes a quantum dot device having a quantum well stack, a plurality of parallel gate lines stacked above one another at a distance from one another (e.g., arranged in a regular pattern with equal spacing between adjacent gate lines stacked above one another, with an insulator material electrically isolating different first gate lines within a given row from one another) over the quantum well stack, and a gate that extends toward the quantum well stack from each of the plurality of parallel gate lines, where the gates from the plurality of parallel gate lines are arranged along a row of a quantum dot formation region in the quantum well stack. The quantum computing device further includes a non-quantum processing device, coupled to the quantum processing device, to control voltages applied to the gates of the quantum dot device; and a memory device to store data generated during operation of the quantum processing device.

Example 51 provides the quantum computing device according to example 50, further including a cooling apparatus to maintain the temperature of the quantum dot device below 5 degrees Kelvin.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
a quantum well stack;
N parallel rows of first gate lines over the quantum well stack, where an individual row of the N parallel rows of the first gate lines includes M parallel first gate lines stacked above one another, where each of N and M is an integer greater than 1; and
a gate that extends toward the quantum well stack from each of the first gate lines,
wherein:
for an individual row of the N parallel rows of the first gate lines, the gates that extend toward the quantum well stack from the M parallel first gate lines are electrically isolated from one another and are above a respective row of a quantum dot formation region in the quantum well stack.

2. The quantum dot device according to claim 1, wherein adjacent rows of the N parallel rows of first gate lines are substantially equidistant.

3. The quantum dot device according to claim 1, further comprising an insulator material between the first gate lines.

4. The quantum dot device according to claim 1, further comprising parallel rows of second gate lines, wherein the second gate lines are oriented perpendicular to the first gate lines.

5. The quantum dot device according to claim 4, wherein the second gate lines are closer to the quantum well stack than the first gate lines.

6. The quantum dot device according to claim 4, further comprising a hardmask between portions of the second gate lines and portions of the first gate lines that are above the portions of the second gate lines.

7. The quantum dot device according to claim 4, further comprising a spacer material between portions of the second gate lines and adjacent portions of the gates.

8. The quantum dot device according to claim 4, wherein at least a subset of the second gate lines is arranged so that, for an individual row of the N parallel rows of the first gate lines, a respective second gate line is between each pair of adjacent gates of the row.

9. The quantum dot device according to claim 8, wherein individual ones of the second gate lines extend across multiple ones of the N parallel rows of the first gate lines.

10. The quantum dot device according to claim 1, further comprising parallel rows of third gate lines, wherein the third gate lines are oriented perpendicular to the second gate lines.

11. The quantum dot device according to claim 10, wherein each of the third gate lines is between the quantum well stack and a different one of the N parallel rows of first gate lines.

12. The quantum dot device according to claim 11, wherein, for the each of the third gate lines, the M parallel first gate lines of the different one of the N parallel rows of first gate lines are stacked above the third gate line.

13. The quantum dot device according to claim 10, wherein the third gate lines are closer to the quantum well stack than the first gate lines.

14. The quantum dot device according to claim 10, further comprising a hardmask between portions of the third gate lines and portions of the first gate lines that are above the portions of the third gate lines.

15. The quantum dot device according to claim 1, further comprising contact vias extending toward respective ones of the first gate lines, wherein, for an individual row of the N parallel rows of the first gate lines, contact vias to the M parallel first gate lines stacked above one another are arranged in a staircase manner.

16. The quantum dot device according to claim 1, wherein the quantum well stack has a first face and a second opposing face, and the first gate lines, the second gate lines, and the third gate lines are at the first face of the quantum well stack.

17. A quantum dot device, comprising:
a quantum well stack;
a plurality of parallel gate lines stacked above one another over the quantum well stack; and
a gate that extends toward the quantum well stack from each of the plurality of parallel gate lines,
wherein the gates from the plurality of parallel gate lines are arranged along a row of a quantum dot formation region in the quantum well stack.

18. The quantum dot device according to claim 17, further comprising:
a first accumulation gate over a first doped region in the quantum well stack; and
a second accumulation gate over a second doped region in the quantum well stack,
wherein:
the first doped region is adjacent to a first end of the row of the quantum dot formation region,
the second doped region is adjacent to a second end of the row of the quantum dot formation region, the second end being opposite the first end, and
a dopant concentration in the row of the quantum dot formation region is lower than a dopant concentration in the first doped region and a dopant concentration in the second doped region.

19. A quantum computing device, comprising:
a quantum processing device, wherein the quantum processing device includes a quantum dot device having:
a quantum well stack,
a plurality of parallel gate lines stacked above one another over the quantum well stack, and
a gate that extends toward the quantum well stack from each of the plurality of parallel gate lines, wherein the gates from the plurality of parallel gate lines are arranged along a row of a quantum dot formation region in the quantum well stack;
a non-quantum processing device, coupled to the quantum processing device, to control voltages applied to the gates of the quantum dot device; and
a memory device to store data generated during operation of the quantum processing device.

20. The quantum computing device according to claim 19, further comprising a cooling apparatus to maintain the temperature of the quantum dot device below 5 degrees Kelvin.

* * * * *